United States Patent
Sugita et al.

(10) Patent No.: US 9,041,699 B2
(45) Date of Patent: May 26, 2015

(54) DISPLAY DEVICE WITH TOUCH SENSOR INCLUDING SIGNAL PROCESSING CIRCUIT WITH PHOTOSENSOR

(75) Inventors: Yasuhiro Sugita, Osaka (JP); Kohei Tanaka, Osaka (JP); Naru Usukura, Osaka (JP); Tadashi Nemoto, Osaka (JP); Hiromi Katoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 206 days.

(21) Appl. No.: 13/698,672

(22) PCT Filed: May 19, 2011

(86) PCT No.: PCT/JP2011/061514
§ 371 (c)(1),
(2), (4) Date: Nov. 19, 2012

(87) PCT Pub. No.: WO2011/145680
PCT Pub. Date: Nov. 24, 2011

(65) Prior Publication Data
US 2013/0057518 A1 Mar. 7, 2013

(30) Foreign Application Priority Data
May 20, 2010 (JP) .................................. 2010-116388

(51) Int. Cl.
| G06F 3/038 | (2013.01) |
| G06F 3/041 | (2006.01) |
| G06F 3/042 | (2006.01) |
| G09G 3/36 | (2006.01) |
| H01L 27/146 | (2006.01) |

(52) U.S. Cl.
CPC ............ *G06F 3/0412* (2013.01); *G06F 3/0418* (2013.01); *G06F 3/042* (2013.01); *G09G 3/3648* (2013.01); *G09G 2360/144* (2013.01); *H01L 27/14621* (2013.01); *H01L 27/14645* (2013.01)

(58) Field of Classification Search
CPC ..................... G09G 2360/14; G09G 2360/142; G09G 2360/144; G09G 2360/145; G06F 3/0421

USPC ................... 345/156, 173–178, 207
See application file for complete search history.

(56) References Cited

U.S. PATENT DOCUMENTS

| 6,900,791 B2 * | 5/2005 | Tanaka et al. ................. 345/156 |
| 2010/0013813 A1 | 1/2010 | Katoh et al. |
| 2010/0134452 A1 * | 6/2010 | Katoh et al. ................. 345/205 |

FOREIGN PATENT DOCUMENTS

| JP | 11-065744 A | 3/1999 |
| JP | 2006-003857 A | 1/2006 |

(Continued)

OTHER PUBLICATIONS

Official Communication issued in International Patent Application No. PCT/JP2011/061514, mailed on Aug. 16, 2011.

*Primary Examiner* — Ram Mistry
(74) *Attorney, Agent, or Firm* — Keating & Bennett, LLP

(57) ABSTRACT

Provided is a display device that has a photodetection element in a pixel and can automatically correct a photosensor signal during operation, while resolving offset error with respect to the true black level or white level. As operation modes, a sensor row driver (5) has: (a) a sensor drive mode in which a sensor drive signal of a first pattern is supplied, and a photosensor signal that corresponds to the amount of light received by the photosensor is output to a signal processing circuit (8), and (b) a correction data acquisition mode in which a sensor drive signal of a second pattern that is different from the first pattern is supplied, and a correction photosensor signal level that corresponds to the case where the photosensor detected a black level or a white level is acquired. The photosensor signal levels obtained in the two modes while the ambient environment is controlled to a predetermined condition are stored in a memory. The signal processing circuit (8) corrects the photosensor signal in the sensor drive mode using the correction photosensor signal level that was corrected using the data for resolving offset.

15 Claims, 16 Drawing Sheets

(56) References Cited

FOREIGN PATENT DOCUMENTS

| | | | |
|---|---|---|---|
| WO | 2007/145346 A1 | 12/2007 | |
| WO | 2007/145347 A1 | 12/2007 | |
| WO | 2008/126872 A1 | 10/2008 | |
| WO | 2008/126873 A1 | 10/2008 | |
| WO | 2008126873 | * 10/2008 | |

* cited by examiner

FIG. 3
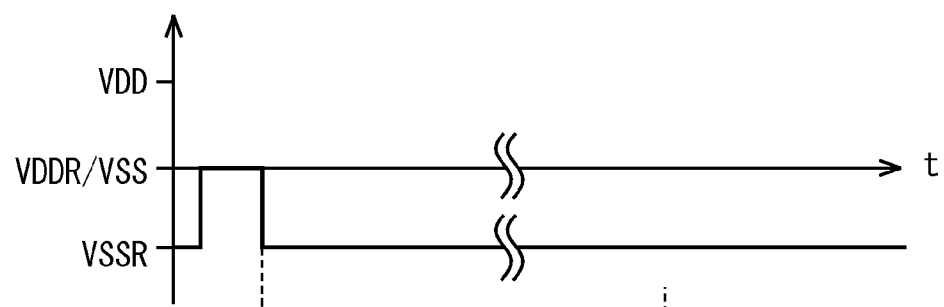
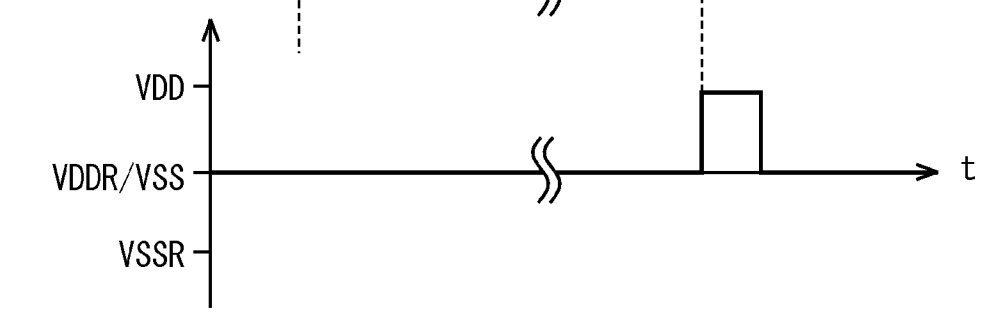

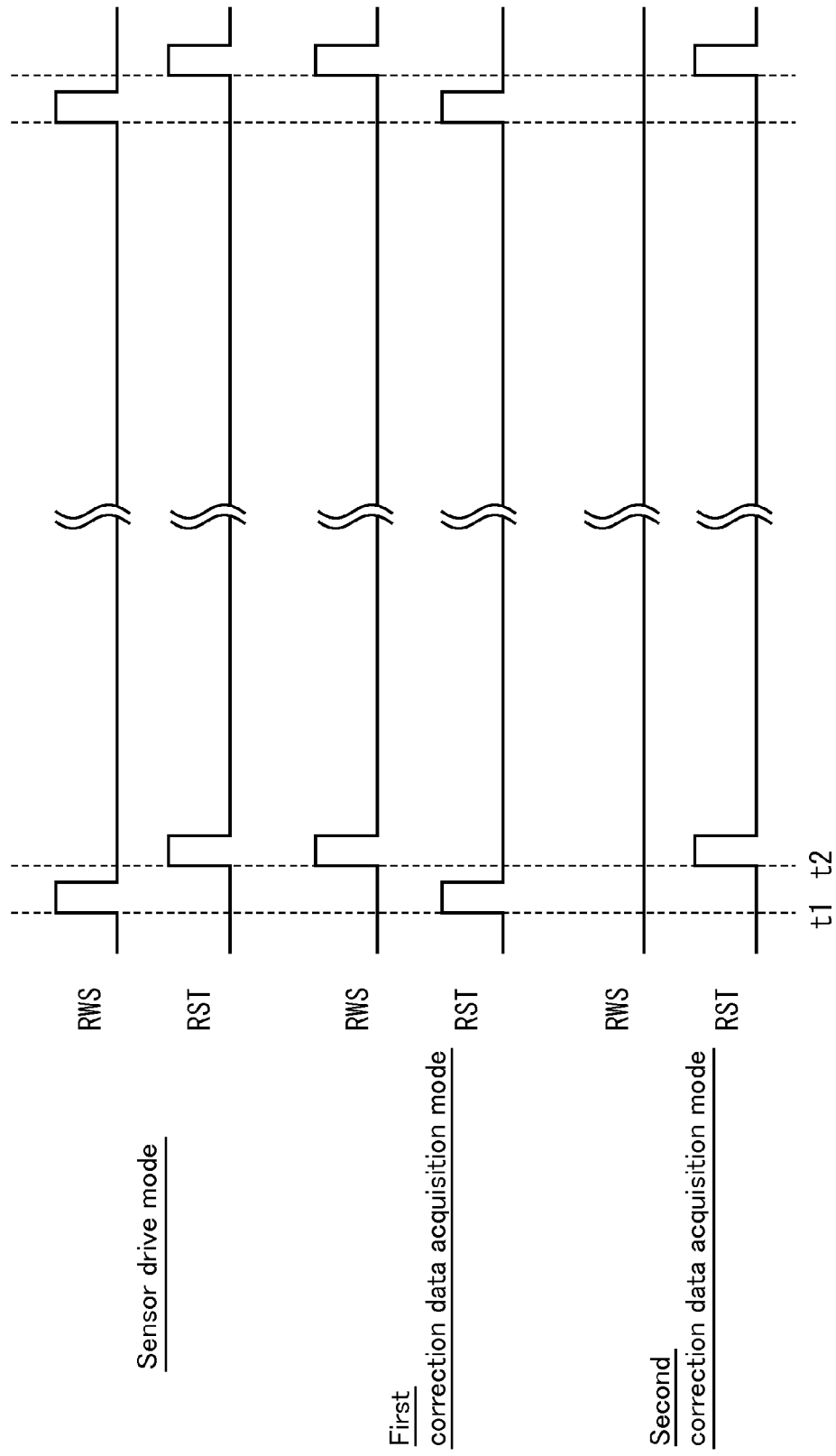

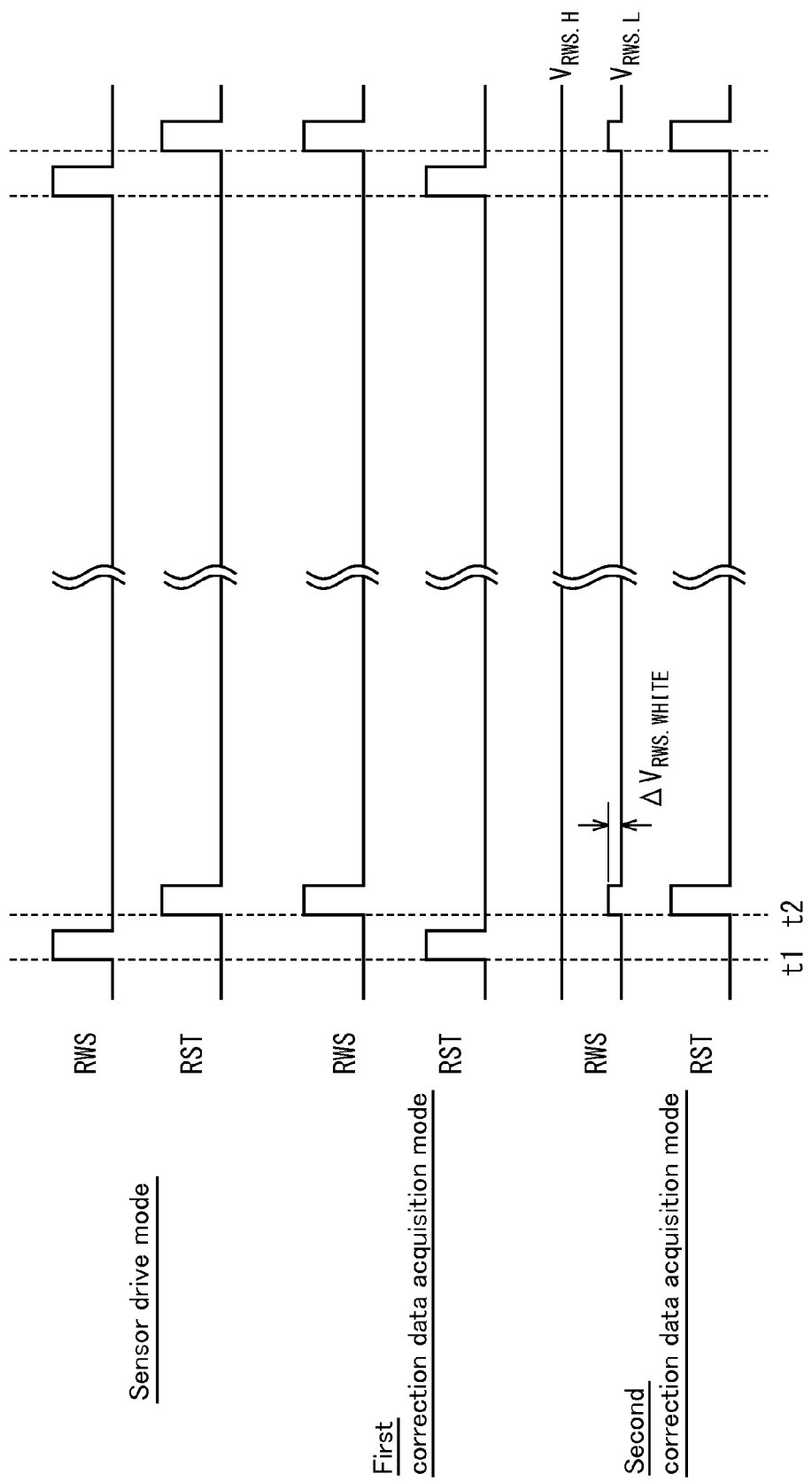

DISPLAY DEVICE WITH TOUCH SENSOR INCLUDING SIGNAL PROCESSING CIRCUIT WITH PHOTOSENSOR

TECHNICAL FIELD

The present invention relates to a display device that has a photodetection element such as a photodiode in a pixel, and in particular relates to a display device in which a photosensor signal can be automatically corrected (calibrated) during operation of the display device.

BACKGROUND ART

Conventionally, a display device with an image pick-up function has been proposed that can pick up an image of an object that has come close to the display due to including photodetection elements such as photodiodes in the pixels. Such a display device with an image pick-up function is envisioned to be used as a bidirectional communication display device or a display device with a touch panel function.

With a conventional display device with an image pick-up function, the photodiodes are formed in the pixels at the same time as well-known constituent elements such as signal lines, scan lines, TFTs (Thin Film Transistors), and pixel electrodes are formed on an active matrix substrate using a semiconductor process. Such a conventional display device with an image pick-up function is disclosed in JP 2006-3857A.

Also, with such a display device with an image pick-up function, there has been the problem that an offset unique to circuits such as an amplifier in the panel is added to the output of the photodetection element before it is finally output as a photosensor signal. In view of this, a proposal for automatically correcting the offset and gain of the photosensor signal is disclosed in WO 2008/126873, for example.

With the configuration disclosed in WO 2008/126873, a black level or white level detection state is artificially created using a drive pattern that is different from that of a normal sensor drive signal, and a photosensor signal is corrected using the detected level as the true black level or white level.

DISCLOSURE OF INVENTION

However, although the configuration disclosed in WO 2008/126873 enables automatically correcting the offset and gain during operation of the display device, there is the problem that when the black level or white level detection state is artificially created by generating a drive pattern that is different from normal driving, offset error appears in the true black level or white level due to a difference in the drive timing or the like.

The present invention was achieved in light of the above-described problems, and an object thereof is to provide a display device that has a photodetection element in a pixel, particularly a display device in which a photosensor signal can be automatically corrected during operation of the display device, while resolving offset error in the true black level or white level.

In order to achieve the above-described object, a display device disclosed here is a display device provided with an active matrix substrate, the display device including: a photosensor provided in a pixel region of the active matrix substrate; sensor drive wiring connected to the photosensor; a sensor driver circuit that supplies a sensor drive signal to the photosensor via the sensor drive wiring; an amplifier circuit that amplifies sensor output that was read out from the photosensor in accordance with the sensor drive signal, and outputs the sensor output as a photosensor signal; and a signal processing circuit that processes the photosensor signal that was output from the amplifier circuit, wherein operation modes of the sensor driver circuit include at least a sensor drive mode in which a sensor drive signal of a first pattern is supplied to the photosensor, and thus a photosensor signal that corresponds to the amount of light received by the photosensor is output to the signal processing circuit, and a correction data acquisition mode in which a sensor drive signal of a second pattern that is different from the first pattern is supplied to the photosensor, and thus a correction photosensor signal level that corresponds to a case where the photosensor detected a black level or a white level is acquired, the display device further includes a memory that stores, as data for resolving offset in the correction photosensor signal level, a photosensor signal level that was obtained by driving the photosensor in each of the sensor drive mode and the correction data acquisition mode in an ambient environment that is controlled to a predetermined condition, and the signal processing circuit corrects the photosensor signal in the sensor drive mode using the correction photosensor signal level that was corrected using the data for resolving offset that was read out from the memory.

The present invention enables providing a display device that has a photodetection element in a pixel, particularly a display device in which a photosensor signal can be automatically corrected during operation of the display device, while resolving offset error in the true black level or white level.

BRIEF DESCRIPTION OF DRAWINGS

FIG. 3 is a timing chart showing waveforms of a reset signal and a readout signal.

FIG. 12 is a waveform diagram showing an example of patterns of the reset signal and the readout signal in respective operation modes of a display device according to Embodiment 2.

FIG. 16 is a waveform diagram showing an example of patterns of a reset signal and a readout signal in respective operation modes of a display device according to Embodiment 3.

DESCRIPTION OF THE INVENTION

Figure 1:
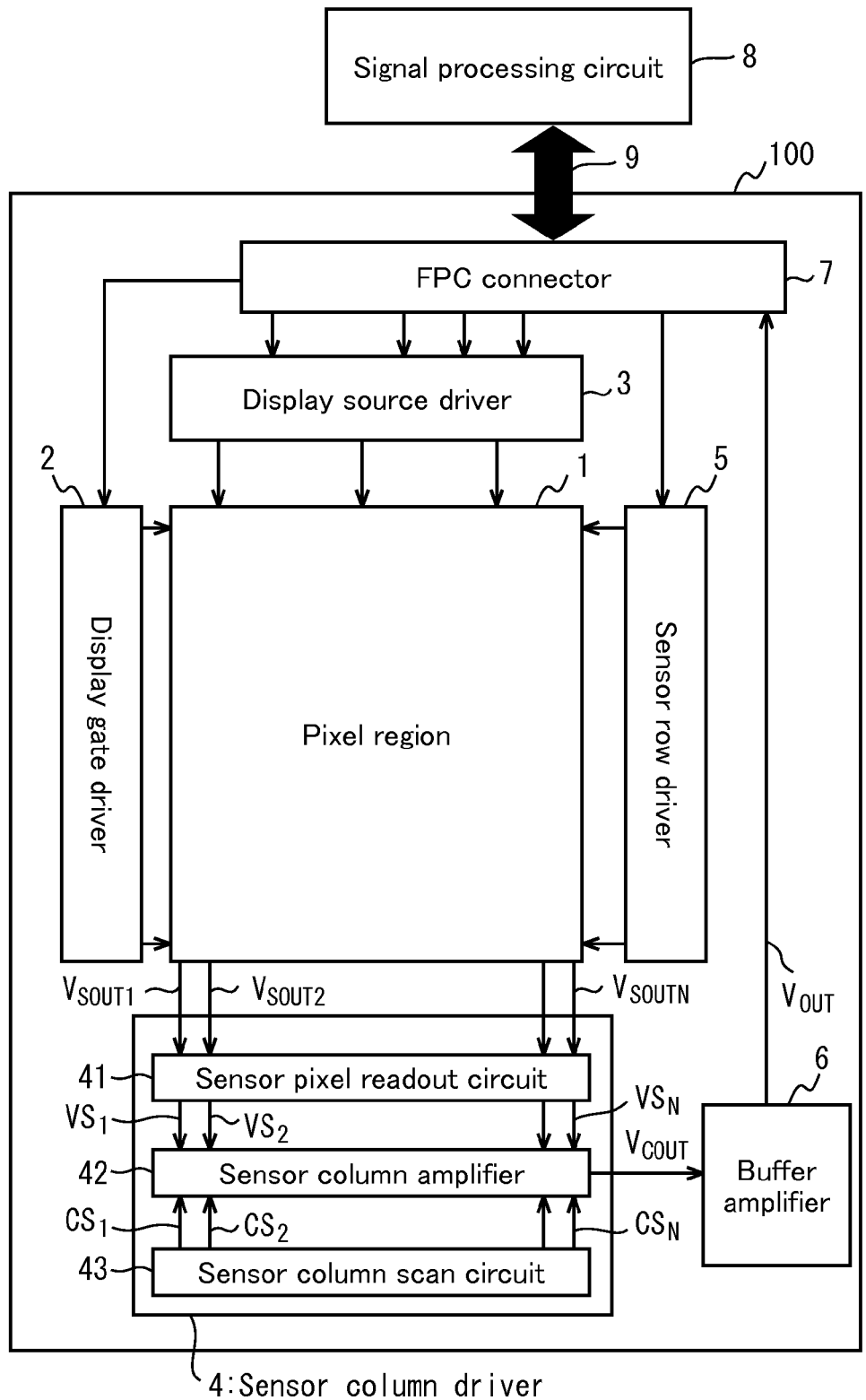
FIG. 1 is a block diagram showing a schematic configuration of a display device according to an embodiment of the present invention.

A display device according to an embodiment of the present invention is a display device provided with an active matrix substrate, the display device including: a photosensor provided in a pixel region of the active matrix substrate; sensor drive wiring connected to the photosensor; a sensor driver circuit that supplies a sensor drive signal to the photosensor via the sensor drive wiring; an amplifier circuit that amplifies sensor output that was read out from the photosensor in accordance with the sensor drive signal, and outputs the sensor output as a photosensor signal; and a signal processing circuit that processes the photosensor signal that was output from the amplifier circuit, wherein operation modes of the sensor driver circuit include at least a sensor drive mode in which a sensor drive signal of a first pattern is supplied to the photosensor, and thus a photosensor signal that corresponds to the amount of light received by the photosensor is output to the signal processing circuit, and a correction data acquisition mode in which a sensor drive signal of a second pattern that is different from the first pattern is supplied to the photosensor, and thus a correction photosensor signal level that corresponds to a case where the photosensor detected a black level or a white level is acquired, the display device further includes a memory that stores, as data for resolving offset in the correction photosensor signal level, a photosensor signal level that was obtained by driving the photosensor in each of the sensor drive mode and the correction data acquisition mode in an ambient environment that is controlled to a predetermined condition, and the signal processing circuit corrects the photosensor signal in the sensor drive mode using the correction photosensor signal level that was corrected using the data for resolving offset that was read out from the memory (first configuration).

In the first configuration, it is preferable that the sensor drive wiring includes reset signal wiring that is connected to the photosensor and readout signal wiring that is connected to the photosensor, the sensor drive signal includes a reset signal that is supplied to the photosensor via the reset signal wiring and a readout signal that is supplied to the photosensor via the readout signal wiring, and in the sensor drive mode, the sensor driver circuit supplies the photosensor with the reset signal, and then with the readout signal after a predetermined time period has elapsed, and thus a photosensor signal that corresponds to the amount of light received by the photosensor in the predetermined time period is output to the signal processing circuit (second configuration).

In the second configuration, it is preferable that the correction data acquisition mode includes a first correction data acquisition mode in which the readout signal is supplied from the sensor driver circuit to the photosensor at a time that is after the start of the supply of the reset signal and before the end of the supply of the reset signal, and thus a first correction photosensor signal level B that corresponds to a case where the photosensor detected a black level is acquired. Furthermore, it is preferable that in an ambient environment that is controlled to a predetermined condition, letting $B_{1st.ini}$ be the photosensor signal level stored in the memory that was obtained by driving the photosensor in the sensor drive mode, and $B_{2nd.ini}$ be the photosensor signal level stored in the memory that was obtained by driving the photosensor in the first correction data acquisition mode, the signal processing circuit obtains a corrected photosensor signal R' from a photosensor signal R in the sensor drive mode as follows (third configuration).

$$R' = R - \{B - (B_{2nd.ini} - B_{1st.ini})\}$$

In the second configuration, it is preferable that the correction data acquisition mode includes a second correction data acquisition mode in which the sensor driver circuit supplies a readout signal whose amplitude is zero, and thus a second correction photosensor signal level W that corresponds to a case where the photosensor detected a white level is acquired. Furthermore, it is preferable that in an ambient environment that is controlled to a predetermined condition, letting $W_{1st.ini}$ be the photosensor signal level stored in the memory that was obtained by driving the photosensor in the sensor drive mode, $W_{3rd.ini}$ be the photosensor signal level stored in the memory that was obtained by driving the photosensor in the second correction data acquisition mode, and L be the number of photosensor signal levels, the signal processing circuit obtains a corrected photosensor signal R' from a photosensor signal R in the sensor drive mode as follows (fourth configuration).

$$R' = L \times R / \{W - (W_{3rd.ini} - W_{1st.ini}) - B_{1st.ini}\}$$

In the second configuration, it is preferable that the correction data acquisition mode includes a first correction data acquisition mode in which the readout signal is supplied from the sensor driver circuit to the photosensor at a time that is after the start of the supply of the reset signal and before the end of the supply of the reset signal, and thus a first correction photosensor signal level B that corresponds to a case where the photosensor detected a black level is acquired, and a second correction data acquisition mode in which the sensor driver circuit supplies a readout signal whose amplitude is zero, and thus a second correction photosensor signal level W that corresponds to a case where the photosensor detected a white level is acquired. Furthermore, it is preferable that in an ambient environment that is controlled to a predetermined condition, letting $B_{1st.ini}$ be the photosensor signal level stored in the memory that was obtained by driving the photosensor in the sensor drive mode, $B_{2nd.ini}$ be the photosensor signal level stored in the memory that was obtained by driving the photosensor in the first correction data acquisition mode, $W_{3rd.ini}$ be the photosensor signal level stored in the memory that was obtained by driving the photosensor in the second correction data acquisition mode, and L be the number of photosensor signal levels, the signal processing circuit obtains a corrected photosensor signal R' from a photosensor signal R in the sensor drive mode as follows (fifth configuration).

$$R'=L/[\{W-(W_{3rd.ini}-W_{1st.ini})\}$$

$$-\{B-(B_{2nd.ini}-B_{1st.ini})\}]$$

$$\times[R-\{B-(B_{2nd.ini}-B_{1st.ini})\}]$$

In the second configuration, it is preferable that the correction data acquisition mode includes a first correction data acquisition mode in which the readout signal is supplied from the sensor driver circuit to the photosensor at a time that is after the start of the supply of the reset signal and after the end of the supply of the reset signal, and thus a first correction photosensor signal level B that corresponds to a case where the photosensor detected a black level is acquired. Furthermore, it is preferable that in an ambient environment that is controlled to a predetermined condition, letting $B_{1st.ini}$ be the photosensor signal level stored in the memory that was obtained by driving the photosensor in the sensor drive mode, and $B_{2nd.ini}$ be the photosensor signal level stored in the memory that was obtained by driving the photosensor in the first correction data acquisition mode, the signal processing circuit obtains a corrected photosensor signal R' from a photosensor signal R in the sensor drive mode as follows (sixth configuration).

$$R'=R-\{B-(B_{2nd.ini}-B_{1st.ini})\}$$

In the second configuration, it is preferable that the correction data acquisition mode includes a second correction data acquisition mode in which the sensor driver circuit supplies a readout signal whose amplitude is zero, and thus a second correction photosensor signal level W that corresponds to a case where the photosensor detected a white level is acquired. Furthermore, it is preferable that in an ambient environment that is controlled to a predetermined condition, letting $B_{1st.ini}$ be the photosensor signal level stored in the memory that was obtained by driving the photosensor in the sensor drive mode, and in an ambient environment that is controlled to a predetermined condition, letting $W_{1st.ini}$ be the photosensor signal level stored in the memory that was obtained by driving the photosensor in the sensor drive mode, $W_{3rd.ini}$ be the photosensor signal level stored in the memory that was obtained by driving the photosensor in the correction data acquisition mode, and L be the number of photosensor signal levels, the signal processing circuit obtains a corrected photosensor signal R' from a photosensor signal R in the sensor drive mode as follows (seventh configuration).

$$R'=L\times R/\{W-(W_{3rd.ini}-W_{1st.ini})-B_{1st.ini}\}$$

In the second configuration, it is preferable that the correction data acquisition mode includes a first correction data acquisition mode in which the readout signal is supplied from the sensor driver circuit to the photosensor at a time that is after the start of the supply of the reset signal and after the end of the supply of the reset signal, and thus a first correction photosensor signal level B that corresponds to a case where the photosensor detected a black level is acquired, and a second correction data acquisition mode in which the sensor driver circuit supplies a readout signal whose amplitude is zero, and thus a second correction photosensor signal level W that corresponds to a case where the photosensor detected a white level is acquired. Furthermore, it is preferable that in an ambient environment that is controlled to a predetermined condition, letting $B_{1st.ini}$ be the photosensor signal level stored in the memory that was obtained by driving the photosensor in the sensor drive mode, and $B_{2nd.ini}$ be the photosensor signal level stored in the memory that was obtained by driving the photosensor in the first correction data acquisition mode, and in an ambient environment that is controlled to a predetermined condition, letting $W_{1st.ini}$ be the photosensor signal level stored in the memory that was obtained by driving the photosensor in the sensor drive mode, $W_{3rd.ini}$ be the photosensor signal level stored in the memory that was obtained by driving the photosensor in the correction data acquisition mode, and L be the number of photosensor signal levels, the signal processing circuit obtains a corrected photosensor signal R' from a photosensor signal R in the sensor drive mode as follows (eighth configuration).

$$R'=L/[\{W-(W_{3rd.ini}-W_{1st.ini})\}$$

$$-\{B-(B_{2nd.ini}-B_{1st.ini})\}]$$

$$\times[R-\{B-(B_{2nd.ini}-B_{1st.ini})\}]$$

In the second configuration, it is preferable that the correction data acquisition mode includes a second correction data acquisition mode in which the sensor driver circuit supplies, in synchronization with the reset signal, a readout signal whose amplitude is $\Delta V_{RWS.WHITE}$ for reading out sensor output that corresponds to a state in which the amount of shift in capacitance output of the photosensor is saturated, and thus a second correction photosensor signal level W that corresponds to a case where the photosensor detected a white level is acquired. Furthermore, it is preferable that in an ambient environment that is controlled to a predetermined condition, letting $W_{1st.ini}$ be the photosensor signal level stored in the memory that was obtained by driving the photosensor in the sensor drive mode, $W_{3rd.ini}$ be the photosensor signal level stored in the memory that was obtained by driving the photosensor in the second correction data acquisition mode, and L be the number of photosensor signal levels, the signal processing circuit obtains a corrected photosensor signal R' from a photosensor signal R in the sensor drive mode as follows (ninth configuration).

$$R'=L\times R/\{W-(W_{3rd.ini}-W_{1st.ini})-B_{1st.ini}\}$$

In the second configuration, it is preferable that the correction data acquisition mode includes a first correction data acquisition mode in which the readout signal is supplied from the sensor driver circuit to the photosensor at a time that is after the start of the supply of the reset signal and after the end of the supply of the reset signal, and thus a first correction photosensor signal level B that corresponds to a case where the photosensor detected a black level is acquired, and a second correction data acquisition mode in which the sensor driver circuit supplies, in synchronization with the reset signal, a readout signal whose amplitude is $\Delta V_{RWS.WHITE}$ for reading out sensor output that corresponds to a state in which the amount of shift in capacitance output of the photosensor is saturated, and thus a second correction photosensor signal level W that corresponds to a case where the photosensor detected a white level is acquired. Furthermore, it is preferable that in an ambient environment that is controlled to a predetermined condition, letting $B_{1st.ini}$ be the photosensor signal level stored in the memory that was obtained by driving the photosensor in the sensor drive mode, and $B_{2nd.ini}$ be the photosensor signal level stored in the memory that was obtained by driving the photosensor in the first correction data acquisition mode, in an ambient environment that is controlled to a predetermined condition, letting $W_{1st.ini}$ be the photosensor signal level stored in the memory that was obtained by driving the photosensor in the sensor drive mode, $W_{3rd.ini}$ be the photosensor signal level stored in the memory that was obtained by driving the photosensor in the second correction data acquisition mode, and L be the number of photosensor signal levels, the signal processing circuit obtains a corrected photosensor signal R' from a photosensor signal R in the sensor drive mode as follows (tenth configuration).

$$R' = L/[\{W - (W_{3rd.ini} - W_{1st.ini})\} - \{B - (B_{2nd.ini} - B_{1st.ini})\}] \times$$
$$[R - \{B - (B_{2nd.ini} - B_{1st.ini})\}]$$

In the ninth and tenth configurations, it is preferable that the photosensor includes one photodiode and a capacitor that is connected to a cathode of the photodiode, and the amplitude $\Delta V_{RWS.WHITE}$ of the readout signal is obtained by the following expression (eleventh configuration).

$$\Delta V_{RWS.WHITE} =$$
$$(V_{RWS.H} - V_{RWS.L}) + (V_F - \Delta V_{RST}) \cdot C_T / C_{INT} + \Delta V_{RST} \cdot C_{PD} / C_{INT}$$
$$\Delta V_{RST} = V_{RST.H} - V_{RST.L}$$

Note that $V_{RWS.H}$ is the high level potential of the readout signal in the sensor drive mode, $V_{RWS.L}$ is the low level potential of the readout signal in the sensor drive mode, $V_F$ is the forward voltage of the photodiode, $V_{RST.H}$ is the high level potential of the reset signal, $V_{RST.L}$ is the low level potential of the reset signal, $C_T$ is the capacitance of a connection point between the photodiode and the capacitor, $C_{PD}$ is the capacitance of the photodiode, and $C_{INT}$ is the capacitance of the capacitor.

Also, in the first to eleventh configurations, it is preferable that the photosensor has one sensor switching element (twelfth configuration).

Also, in the first to eleventh configurations, it is preferable that the display device further includes; a common substrate opposing the active matrix substrate; and liquid crystal sandwiched between the active matrix substrate and the common substrate.

EMBODIMENTS

Below is a description of more detailed embodiments of the present invention with reference to the drawings. Note that although the following embodiments show examples of configurations in which a display device according to the present invention is implemented as a liquid crystal display device, the display device according to the present invention is not limited to a liquid crystal display device, and is applicable to an arbitrary display device that uses an active matrix substrate. It should also be noted that due to having an image pick-up function, the display device according to the present invention is envisioned to be used as, for example, a display device with a touch panel that performs input operations by detecting an object that has come close to the screen, or a bidirectional communication display device that is equipped with a display function and an image capture function.

Also, for the sake of convenience in the description, the drawings that are referenced below show simplifications of, among the constituent members of the embodiments of the present invention, only relevant members that are necessary for describing the present invention. Accordingly, the display device according to the present invention may include arbitrary constituent members that are not shown in the drawings referenced in this specification. Also, regarding the dimensions of the members in the drawings, the dimensions of the actual constituent members, the ratios of the dimensions of the members, and the like are not shown faithfully.

Embodiment 1

First, a configuration of an active matrix substrate included in a liquid crystal display device according to Embodiment 1 of the present invention will be described with reference to FIGS. 1 and 2.

FIG. 1 is a block diagram showing a schematic configuration of an active matrix substrate 100 included in the liquid crystal display device according to an embodiment of the present invention. As shown in FIG. 1, the active matrix substrate 100 includes at least a pixel region 1, a display gate driver 2, a display source driver 3, a sensor column driver 4, a sensor row driver 5, a buffer amplifier 6, and an FPC connector 7 on a glass substrate. Also, a signal processing circuit 8 for processing image signals picked up by a photodetection element (described later) in the pixel region 1 is connected to the active matrix substrate 100 via the FPC connector 7 and an FPC 9.

Note that the above constituent members on the active matrix substrate 100 can also be formed monolithically on the glass substrate by a semiconductor process. Alternatively, a configuration is possible in which the amplifier and various drivers among the above constituent members are mounted on the glass substrate by COG (Chip On Glass) technology or the like. As another alternative, it is possible for at least a portion of the above constituent members shown on the active matrix substrate 100 in FIG. 1 to be mounted on the FPC 9. The active matrix substrate 100 is attached to a common substrate (not shown) that has a common electrode formed on the entire face thereof, and a liquid crystal material is enclosed in the gap therebetween.

The pixel region 1 is a region in which a plurality of pixels are formed in order to display an image. In the present embodiment, a photosensor for picking up an image is provided in each pixel in the pixel region 1. FIG. 2 is an equivalent circuit diagram showing the arrangement of the pixels and photosensors in the pixel region 1 of the active matrix substrate 100. In the example in FIG. 2, each pixel is formed by three colors of picture elements (also referred to as "sub pixels"), namely R (red), G (green), and B (blue), and one photosensor is provided in each of the pixels configured by these three picture elements. The pixel region 1 has pixels disposed in a matrix having M rows×N columns, and photosensors that are likewise disposed in a matrix having M rows×N columns. Note that as described above, the number of picture elements is M×3N.

Figure 2:
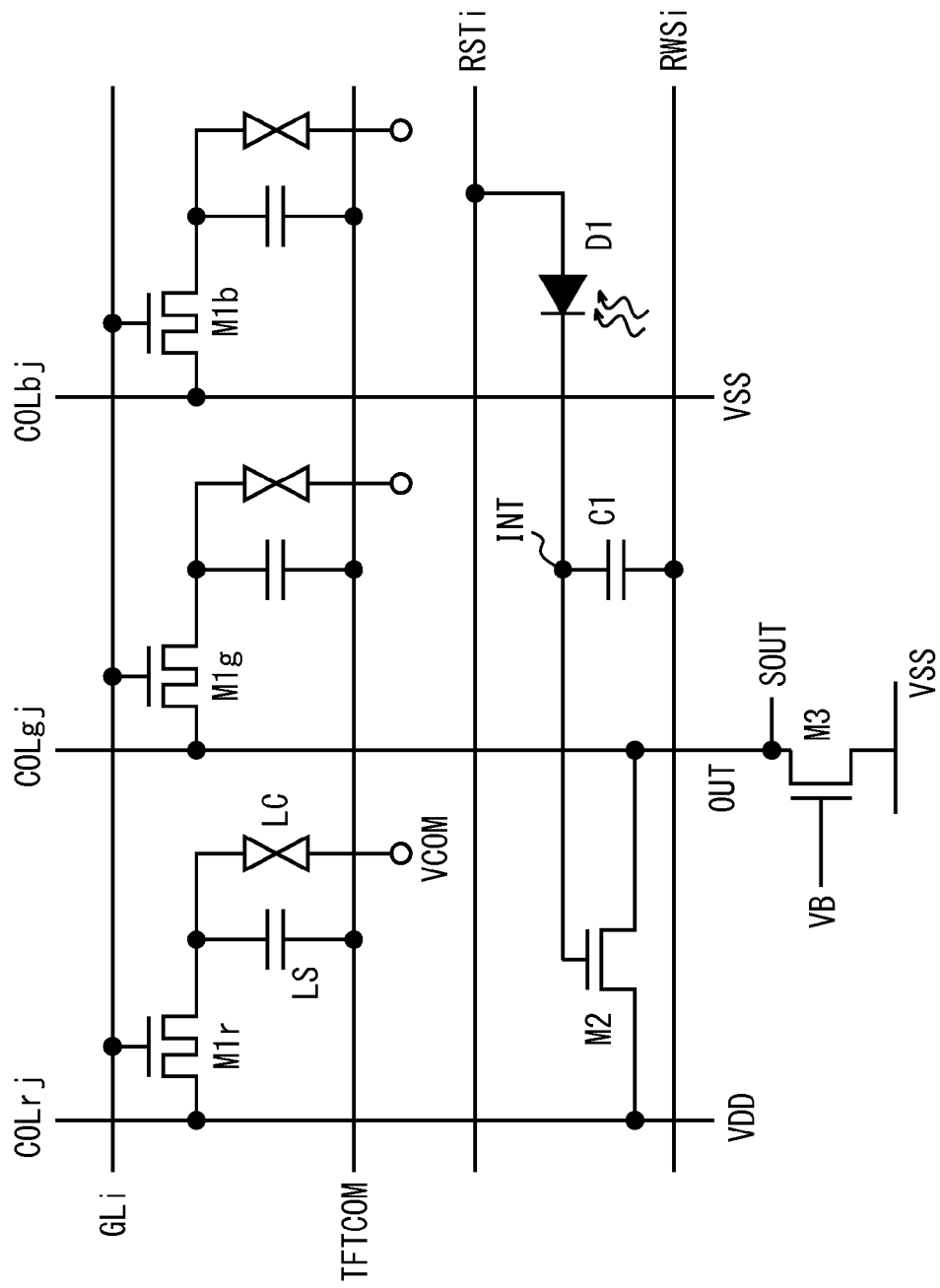
FIG. 2 is an equivalent circuit diagram showing a configuration of a pixel in a display device according to an embodiment of the present invention.

For this reason, as shown in FIG. 2, the pixel region 1 has, as wiring for the pixels, gate lines GL and source lines COL that are disposed in a matrix. The gate lines GL are connected to the display gate driver 2. The source lines COL are connected to the display source driver 3. Note that the gate lines GL are provided in M rows in the pixel region 1. Hereinafter, the notation GLi (i=1 to M) is used when there is a need to distinguish between individual gate lines GL in the description. Meanwhile, three of the source lines COL are provided in each pixel in order to respectively supply image data to the three picture elements in each pixel as described above. The notations COLrj, COLgj, and COLbj (j=1 to N) are used when there is a need to distinguish between individual source lines COL in the description.

Thin-film transistors (TFTs) M1 are provided as switching elements for the pixels at intersections between the gate lines GL and the source lines COL. Note that in FIG. 2, the thin-film transistors M1 provided in the red, green, and blue picture elements are noted as M1r, M1g, and M1b respectively. In each thin-film transistor M1, the gate electrode is connected to one of the gate lines GL, the source electrode is connected to one of the source lines COL, and the drain electrode is connected to a pixel electrode, which is not shown. Accordingly, as shown in FIG. 2, a liquid crystal capacitor LC is formed between the drain electrode of each thin-film transistor M1 and the common electrode (VCOM). Also, an auxiliary capacitor LS is formed between each drain electrode and a TFTCOM.

In FIG. 2, the picture element driven by the thin-film transistor M1r, which is connected to the intersection between one gate line GLi and one source line COLrj, is provided with a red color filter so as to correspond to that picture element, and red image data is supplied from the display source driver 3 to that picture element via the source line COLrj, and thus that picture element functions as a red picture element. Also, the picture element driven by the thin-film transistor M1g, which is connected to the intersection between the gate line GLi and the source line COLgj, is provided with a green color filter so as to correspond to that picture element, and green image data is supplied from the display source driver 3 to that picture element via the source line COLgj, and thus that picture element functions as a green picture element. Furthermore, the picture element driven by the thin-film transistor M1b, which is connected to the intersection between the gate line GLi and the source line COLbj, is provided with a blue color filter so as to correspond to that picture element, and blue image data is supplied from the display source driver 3 to that picture element via the source line COLbj, and thus that picture element functions as a blue picture element.

Note that in the example in FIG. 2, the photosensors are provided in the ratio of one per pixel (three picture elements) in the pixel region 1. However, the disposition ratio of the pixels and photosensors is arbitrary and not limited to merely this example. For example, one photosensor may be disposed per picture element, and a configuration is possible in which one photosensor is disposed for a plurality of pixels.

As shown in FIG. 2, the photosensor includes a photodiode D1 as a photodetection element, a capacitor C1, and a transistor M2. In the example in FIG. 2, the source line COLr also serves as wiring VDD, which is for supplying a constant voltage $V_{DD}$ from the sensor column driver 4 to the photosensor. Also, the source line COLg also serves as wiring OUT for sensor output.

The anode of the photodiode D1 is connected to wiring RST, which is for supplying a reset signal. The cathode of the photodiode D1 is connected to one of the electrodes of the capacitor C1 and the gate of the transistor M2. The drain of the transistor M2 is connected to the wiring VDD, and the source is connected to the wiring OUT. In FIG. 2, INT denotes the connection point between the cathode of the photodiode D1, the one electrode of the capacitor C1, and the gate of the transistor M2. The other electrode of the capacitor C1 is connected to wiring RWS, which is for supplying a readout signal. The wiring RST and the wiring RWS are connected to the sensor row driver 5. Since the wiring RST and RWS are provided in each row, the notations RSTi and RWSi (i=1 to M) are used hereinafter when there is a need to distinguish between the wiring.

The sensor row driver 5 successively selects each group of wiring RSTi and wiring RWSi shown in FIG. 2 at a predetermined time interval $t_{row}$. Accordingly, each photosensor row in the pixel region 1 from which a signal charge is to be read out is successively selected.

Note that as shown in FIG. 2, the end of the wiring OUT is connected to the drain of an insulated gate field effect transistor M3. Also, the drain of this transistor M3 is connected to output wiring SOUT, and a potential $V_{SOUT}$ of the drain of the transistor M3 is output to the sensor column driver 4 as an output signal from the photosensor. The source of the transistor M3 is connected to the wiring VSS. The gate of the transistor M3 is connected to a reference voltage power supply (not shown) via reference voltage wiring VB.

Hereinafter, the reading out of sensor output from the pixel region 1 is described with reference to FIG. 3. FIG. 3 is a timing chart showing the waveforms of the reset signal supplied from the wiring RST to the photosensor and the readout signal supplied from the wiring RWS to the photosensor. As shown in FIG. 3, the high level $V_{RST.H}$ of the reset signal is 0 V, and the low level $V_{RST.L}$ thereof is −4 V. In this example, the high level $V_{RST.H}$ of the reset signal is equivalent to $V_{SS}$. Also, the high level $V_{RWS.H}$ of the readout signal is 8 V, and the low level $V_{RWS.L}$ thereof is 0 V. In this example, the high level $V_{RWS.H}$ of the readout signal is equivalent to $V_{DD}$, and the low level $V_{RWS.L}$ thereof is equivalent to $V_{SS}$.

First, when the reset signal supplied from the sensor row driver 5 to the wiring RST rises from the low level (−4 V) to the high level (0 V), the photodiode D1 becomes forward biased, and the potential $V_{INT}$ of the connection point INT is expressed by Expression (1) below.

$$V_{INT}=V_{RST.H}-V_F \tag{1}$$

In Expression (1), $V_{RST.H}$ is 0 V, which is the high level of the reset signal, and $V_F$ is the forward voltage of the photodiode D1. Since $V_{INT}$ is lower than the threshold voltage of the transistor M2 at this time, the transistor M2 is in a non-conducting state in the reset period.

Next, the reset signal returns to the low level $V_{RST.L}$, and thus the photocurrent integration period ($t_{INT}$) begins. In the integration period, a photocurrent that is proportional to the amount of light incident on the photodiode D1 flows to the capacitor C1, thus causing the capacitor C1 to discharge. Accordingly, the potential $V_{INT}$ at the connection point INT when the integration period ends is expressed by Expression (2) below. $\Delta V_{RST}$ is the pulse height of the reset signal ($V_{RST.H}-V_{RST.L}$), and $C_{PD}$ is the capacitance of the photodiode D1. $C_T$ is the total capacitance of the connection point INT, which is the sum of the capacitance $C_{INT}$ of the capacitor C1, the capacitance $C_{PD}$ of the photodiode D1, and the capacitance $C_{TFT}$ of the transistor M2.

$$V_{INT}=V_{RST.H}-V_F-\Delta V_{RST}\cdot C_{PD}/C_T-I_{PHOTO}\cdot t_{INT}/C_T \tag{2}$$

In Expression (2), $I_{PHOTO}$ is the photocurrent of the photodiode D1, and $t_{INT}$ is the length of the integration period. In the integration period as well, $V_{INT}$ is lower than the threshold voltage of the transistor M2, and therefore the transistor M2 is in the non-conducting state.

When the integration period ends, the readout signal RWS rises as shown in FIG. 3, and thus the readout period begins. Here, the injection of charge into the capacitor C1 occurs. As a result, the potential $V_{INT}$ at the connection point INT is expressed by Expression (3) below.

$$V_{INT}=V_{RST.H}-V_F-I_{PHOTO}\cdot t_{INT}/C_T+\Delta V_{RWS}\cdot C_{INT}/C_T \tag{3}$$

Since $\Delta V_{RWS}$ is the pulse height of the readout signal ($V_{RWS.H}-V_{RWS.L}$), the potential $V_{INT}$ at the connection point INT is higher than the threshold voltage of the transistor M2, and therefore the transistor M2 enters the conducting state and functions as a source follower amplifier along with the bias transistor M3 provided at the end of the wiring OUT in each column. In other words, the output signal voltage from the output wiring SOUT from the drain of the transistor M3 corresponds to the integral value of the photocurrent of the photodiode D1 in the integration period.

As described above, periodically performing a cycle of operations including initialization with a reset pulse, integration of the photocurrent in the integration period, and readout of sensor output in the readout period corresponds to a sensor drive mode of the display device according to the present embodiment.

Figure 4:
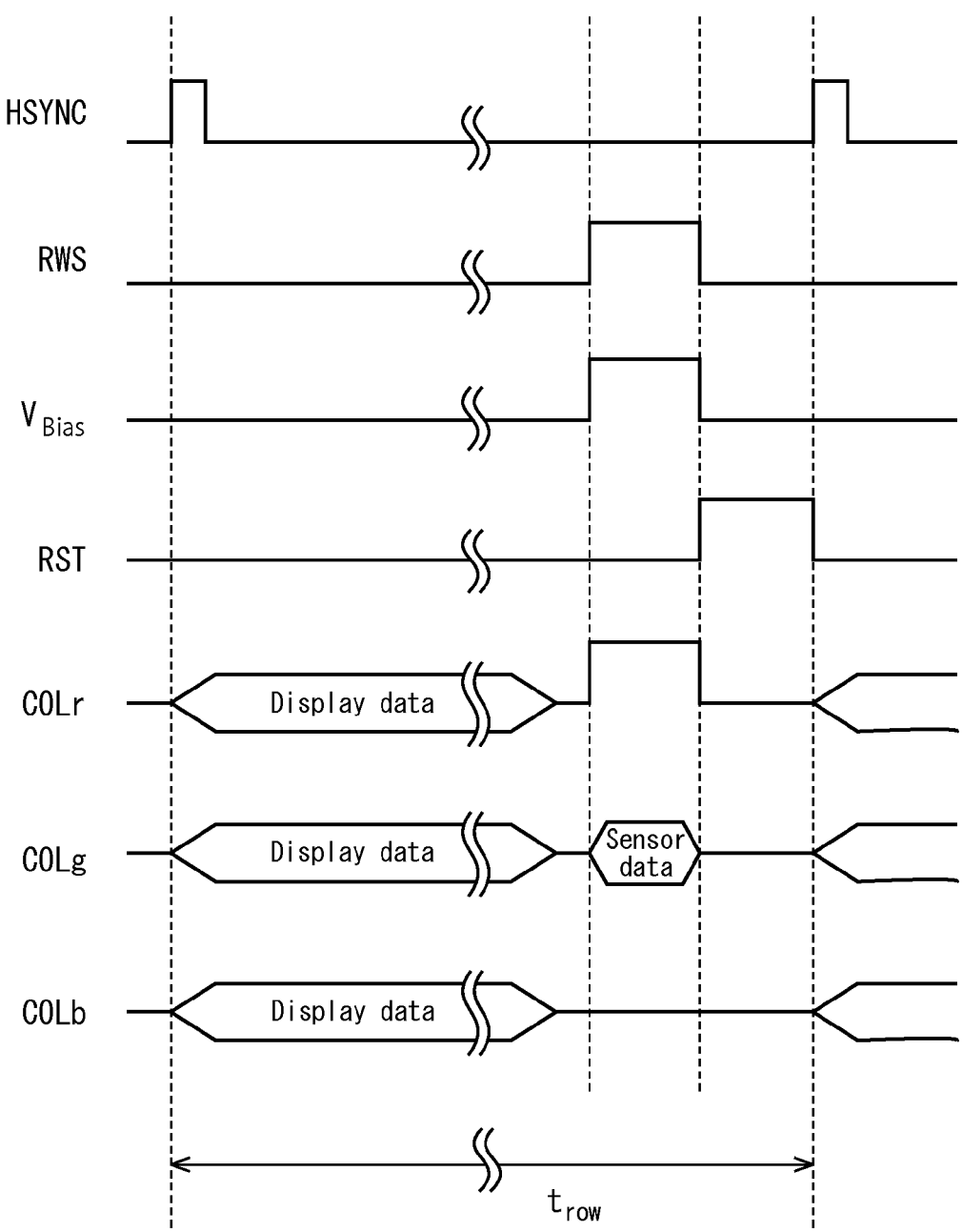
FIG. 4 is a timing chart showing sensor drive timing in a display device according to an embodiment of the present invention.

Note that in the present embodiment, as previously described, the source lines COLr, COLg, and COLb are also used as the photosensor wiring VDD, OUT, and VSS, and therefore as shown in FIG. 4, it is necessary to distinguish between times when image data signals for display are input via the source lines COLr, COLg, and COLb, and times when sensor output is read out via the source lines COLr, COLg, and COLb. In the example in FIG. 4, after the input of the image data signal for display in a horizontal scan period has ended, the reading out of the sensor output in the sensor drive mode is performed using a horizontal blanking period or the like.

As shown in FIG. 1, the sensor column driver 4 includes a sensor pixel readout circuit 41, a sensor column amplifier 42, and a sensor column scan circuit 43. The sensor pixel readout circuit 41 is connected to the wiring SOUT (see FIG. 2) that outputs the sensor output $V_{SOUT}$ from the pixel region 1. In FIG. 1, the sensor output that is output by output wiring SOUTj (j=1 to N) is noted as $V_{SOUTj}$. The sensor pixel readout circuit 41 outputs peak hold voltages $V_{Sj}$, of the sensor output $V_{SOUTj}$ to the sensor column amplifier 42. The sensor column amplifier 42 includes N column amplifiers that respectively correspond to the photosensors in the N columns in the pixel region 1, and the column amplifiers respectively amplify the peak hold voltages $V_{Sj}$ (j=1 to N), and output the resulting peak hold voltages to the buffer amplifier 6 as $V_{COUT}$. The sensor column scan circuit 43 outputs column select signals $CS_j$ (j=1 to N) to the sensor column amplifier 42 in order to successively connect the column amplifiers of the sensor column amplifier 42 to the output bound for the buffer amplifier 6.

Figure 5:
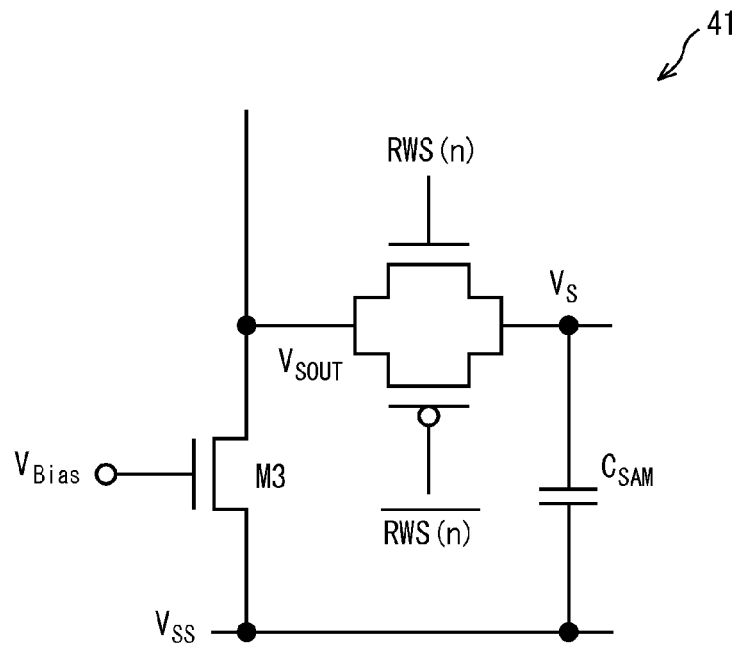
FIG. 5 is a circuit diagram showing an internal configuration of a sensor pixel readout circuit.
Figure 6:
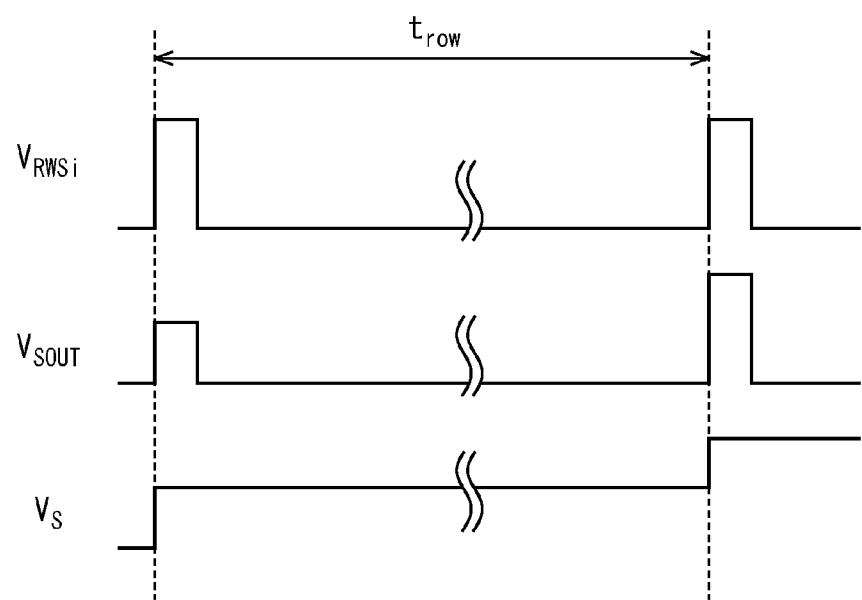
FIG. 6 is a waveform diagram showing a relationship between a readout signal, sensor output, and output of the sensor pixel readout circuit.

The following describes operations of the sensor column driver 4 and the buffer amplifier 6 that are performed after the sensor output $V_{SOUT}$ has been read out from the pixel region 1, with reference to FIGS. 5 and 6. FIG. 5 is a circuit diagram showing an internal configuration of the sensor pixel readout circuit 41. FIG. 6 is a waveform diagram showing a relationship between the readout signal $V_{RWS}$, sensor output $V_{SOUT}$, and output $V_S$ of the sensor pixel readout circuit. As previously described, when the readout signal has risen to the high level $V_{RWS.H}$, the transistor M2 becomes conductive, and therefore a source follower amplifier is formed by the transistors M2 and M3, and the sensor output $V_{SOUT}$ is stored in a sample capacitor $C_{SAM}$ of the sensor pixel readout circuit 41. Accordingly, even after the readout signal has fallen to the low level $V_{RWS.L}$, in the selection period of that row (trout), the output voltage $V_S$ from the sensor pixel readout circuit 41 to the sensor column amplifier 42 is kept at the same level as the peak value of the sensor output $V_{SOUT}$, as shown in FIG. 6.

Figure 7:
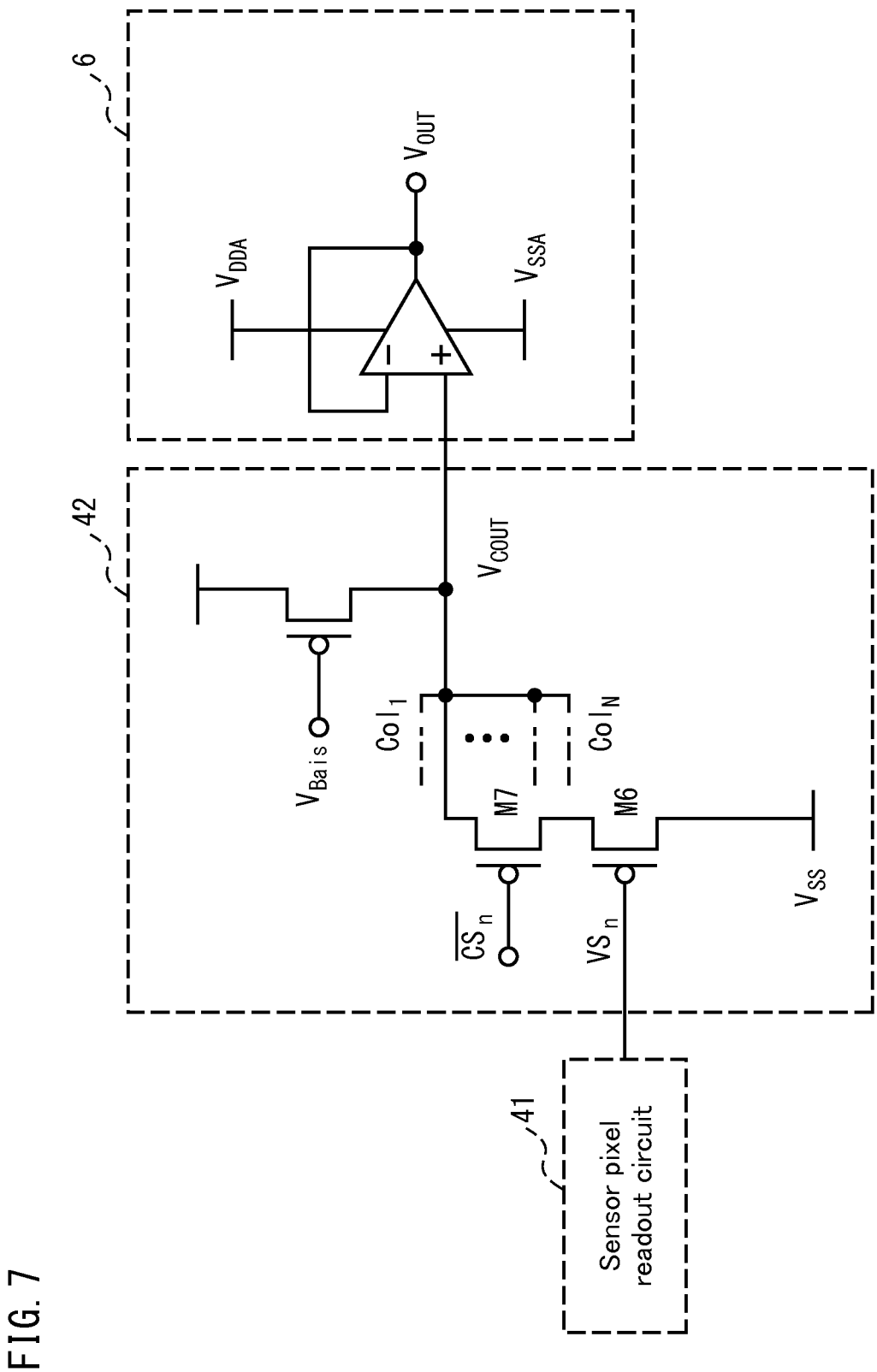
FIG. 7 is a circuit diagram showing an exemplary configuration of a sensor column amplifier.

Next is a description of operations of the sensor column amplifier 42 with reference to FIG. 7. As shown in FIG. 7, the output voltages $V_{Sj}$ (j=1 to N) of the columns are input from the sensor pixel readout circuit 41 to the N column amplifiers of the sensor column amplifier 42. As shown in FIG. 7, each column amplifier is configured by transistors M6 and M7. The column select signals $CS_j$ generated by the sensor column scan circuit 43 successively become on for each of the N columns in the select period of one row ($t_{row}$), and therefore the transistor M6 of any one of the N column amplifiers in the sensor column amplifier 42 is switched on, and only any one of the output voltages $V_{Sj}$ (j=1 to N) of the columns is output as the output $V_{COUT}$ from the sensor column amplifier 42 via that transistor M6. The buffer amplifier 6 then amplifies the $V_{COUT}$ that has been output from the sensor column amplifier 42, and outputs the resulting amplified $V_{COUT}$ to the signal processing circuit 8 as panel output (a photosensor signal) $V_{out}$.

Note that although the sensor column scan circuit 43 may scan the photosensor columns one column at a time as described above, there is no limitation to this, and a configuration is possible in which the photosensor columns are interlace-scanned. Also, the sensor column scan circuit 43 may be formed as a multi-phase drive scan circuit that has, for example, four phases.

According to the above configuration, in the sensor drive mode, the display device according to the present embodiment obtains panel output $V_{OUT}$ that corresponds to the amount of light received by the photodiode D1 formed in each pixel in the pixel region 1. The panel output $V_{OUT}$ is sent to the signal processing circuit 8, subjected to A/D conversion, and then stored in a memory (not shown) as panel output data. Specifically, the same number of panel output data pieces as the number of pixels (number of photosensors) in the pixel region 1 are stored in this memory. With use of the panel output data stored in the memory, the signal processing circuit 8 performs various types of signal processing such as image pickup and the detection of a touch area. Note that although the same number of panel output data pieces as the number of pixels (number of photosensors) in the pixel region 1 are stored in the memory of the signal processing circuit 8 in the present embodiment, due to constraints such as memory capacity, there is no need to necessarily store the same number of panel output data pieces as the number of pixels.

Note that besides the sensor drive mode in which a photosensor signal is read out from each pixel in the pixel region 1, the display device of the present embodiment has a first correction data acquisition mode in which the reset signal is set to the high level, and then the readout signal is set to the high level in order to obtain first correction panel output $V_{Black}$ for the correction of panel output, and a second correction data acquisition mode in which the readout signal is held at the low level and only the reset signal is supplied at a predetermined time interval in order to obtain second correction panel output $V_{White}$ for the correction of panel output. The first correction panel output $V_{Black}$ is the initial charge level of the photosensor in the pixel, and is used as a black level offset value. The second correction panel output $V_{White}$ is used as an offset value for correcting the gain of the sensor column amplifier, the buffer amplifier, or the like.

Figure 8:
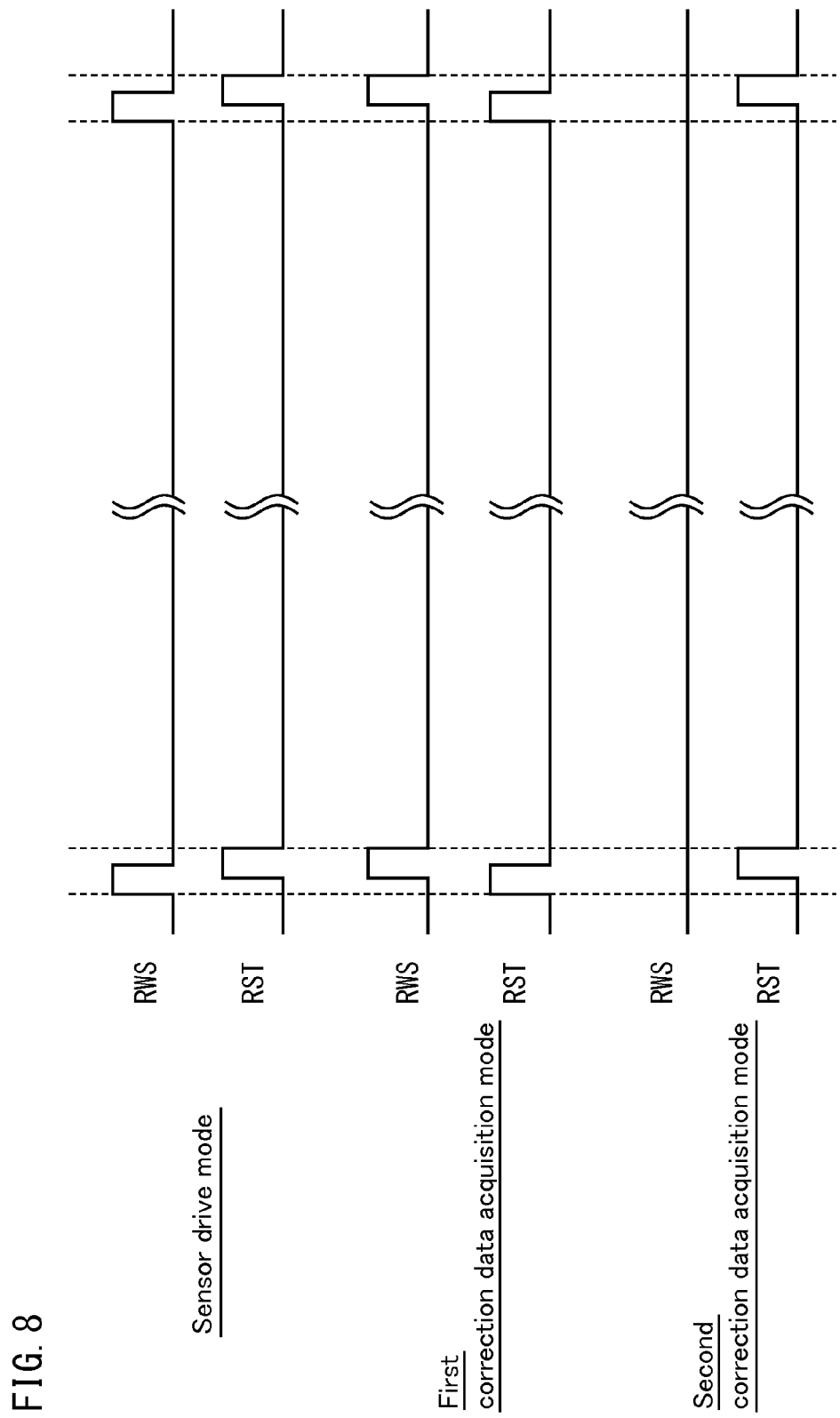
FIG. 8 is a waveform diagram showing an example of patterns of the reset signal and the readout signal in respective operation modes of a display device according to Embodiment 1.

The pattern of the reset signal and the readout signal is different between the sensor drive mode and the first and second correction data acquisition modes. FIG. 8 is a waveform diagram showing an example of patterns of the reset signal and the readout signal in the sensor drive mode and the first and second correction data acquisition modes. As shown in FIGS. 8 and 12, in the sensor drive mode, the reset signal supplied to the wiring RST rises to the high level after the readout signal supplied from the sensor row driver 5 to the wiring RWS rises to the high level. In the example in FIG. 8, in the sensor drive mode, the reset signal rises to the high level while the readout signal is at the high level (before the readout signal falls to the low level).

In the first correction data acquisition mode, the timing at which the reset signal rises to the high level and the timing at which the readout signal rises to the high level are the opposite of those in the case of the sensor drive mode. Specifically, as shown in FIG. 8, in the first correction data acquisition mode, the readout signal rises to the high level after the reset signal rises to the high level. In other words, at the timing at which the reset signal rises to the high level in the sensor drive mode, the readout signal rises to the high level in the first correction data acquisition mode, and at the timing at which the readout signal rises to the high level in the sensor drive mode, the reset signal rises to the high level in the first correction data acquisition mode. Note that in the example in FIG. 8, the reset signal supply period (period for which the reset signal is at the high level) and the readout signal supply period (period for which the readout signal is at the high level) overlap each other in the sensor drive mode and the first correction data acquisition mode, and the total sensor drive signal supply time can be short. Note that as will be described later, the supply of these sensor drive signals is performed in a display blanking period, and therefore this short total sensor drive signal supply time has the advantage of also enabling the application of the present invention to a display device having a diagram in which the blanking period is short.

Figure 9A:
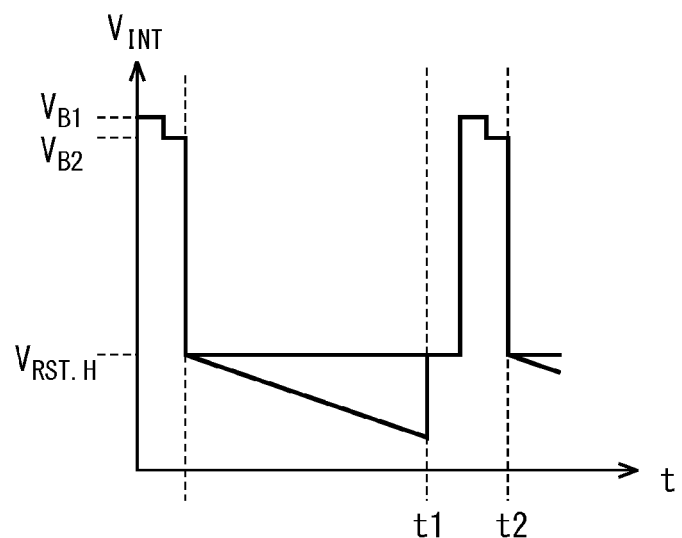
FIG. 9A is a waveform diagram of $V_{INT}$ in a first correction data acquisition mode shown in FIG. 8.
Figure 9B:
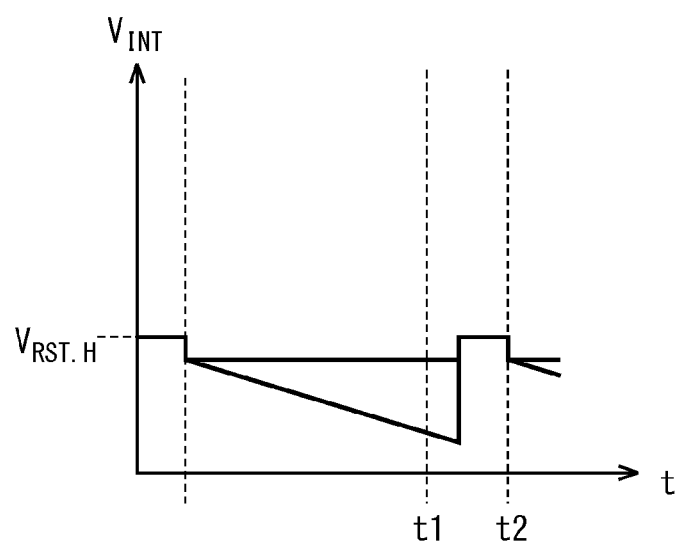
FIG. 9B is a waveform diagram of $V_{INT}$ in a second correction data acquisition mode shown in FIG. 8.

FIG. 9A is a waveform diagram of $V_{INT}$ in the first correction data acquisition mode shown in FIG. 8, and FIG. 9B is a waveform diagram of $V_{INT}$ in the second correction data acquisition mode shown in FIG. 8. As shown in FIGS. 8 and 9A, in the first correction data acquisition mode, when the reset signal rises to the high level at time t1, the value of $V_{INT}$ is the high level potential of the reset signal ($V_{RST.H}$). Thereafter, the readout signal rises to the high level, and thus the value of $V_{INT}$ rises to $V_{B1}$.

Note that the value of $V_{B1}$ is expressed by Expression (4) below.

$$V_{B1} = \Delta V_{RWS} \cdot C_{INT}/C_T \quad (4)$$

$\Delta V_{RWS}$ is the pulse height of the readout signal ($V_{RWS.H} - V_{RWS.L}$). Since this potential $V_{INT}$ is higher than the threshold voltage of the transistor M2, the transistor M2 enters the conductive state, the sensor output $V_{SOUT}$ is read out from the photosensor, and panel output $V_{OUT}$ that corresponds to the sensor output $V_{SOUT}$ is obtained. Note that since the photodiode D1 itself has a parasitic capacitance, the potential $V_{INT}$ drops to $V_{B2}$ according to that parasitic capacitance since the parasitic capacitance is charged after the supply of the reset signal as shown in FIG. 9A. The value of the panel output $V_{OUT}$ obtained from the sensor output $V_{B2}$ after the potential drop is used as the first correction panel output $V_{Black}$ for the correction of the panel output.

In the second correction data acquisition mode shown in FIGS. 8 and 9B, the timings and the levels of the reset signal are the same as in the sensor drive mode, but the readout signal is always at the low level. Accordingly, in the second correction data acquisition mode, the potential $V_{INT}$ at the connection point INT is lower than the threshold voltage of the transistor M2, and therefore the transistor M2 is always off. Accordingly, in the second correction data acquisition mode, the panel output $V_{OUT}$ that is output from the buffer amplifier 6 does not include sensor output from the photosensor of the pixel region 1, and is a value that reflects only the offset that arises in the sensor pixel readout circuit 41, the sensor column amplifier 42, the buffer amplifier 6, and the like. The value of the panel output $V_{OUT}$ obtained at this time is used as the second correction panel output $V_{White}$ for the correction of panel output.

Note that it is preferable that frames for the execution of sensor driving in the first correction data acquisition mode and the second correction data acquisition mode are inserted at a predetermined interval between frames for the execution of sensor driving in the sensor drive mode. Specifically, sensor driving in the sensor drive mode is executed using the horizontal blanking period of the display or the like as described with reference to FIG. 4. Accordingly, it is conceivable for frames for the execution of sensor driving in the first correction data acquisition mode or the second correction data acquisition mode to be inserted in the vertical blanking period or the horizontal scan period of a dummy row, one or more of which are provided above/below the pixel region. Note that the first correction data acquisition mode and the second correction data acquisition mode may be executed in two consecutive frames, or may be executed in non-consecutive frames. Also, since there is no need to obtain sensor output from each pixel in the second correction data acquisition mode, only one row-worth of panel output needs to be acquired from an arbitrary row.

Also, with a liquid crystal display device of the present embodiment, before factory shipment, sensor driving is executed in each of the sensor drive mode and the first correction data acquisition mode in an ambient environment that is controlled to predetermined conditions, and the obtained luminance data is stored in a memory. Specifically, the temperature state is set to a predetermined temperature, the luminance of the display backlight is set to a predetermined brightness, ambient light (outside light) is completely blocked, and sensor driving is executed in both the sensor drive mode and the first correction data acquisition mode in this state. Luminance data obtained by performing A/D conversion on panel output $V_{Black}$ obtained when operating in the sensor drive mode is noted as $B_{1st.ini}$. Luminance data obtained by performing A/D conversion on panel output $V_{Black}$ obtained when operating in the first correction data acquisition mode is noted as $B_{2nd.ini}$. This luminance data is stored in a memory in the signal processing circuit 8, for example.

Similarly, before factory shipment, sensor driving is executed in both the sensor drive mode and the second correction data acquisition mode in an ambient environment that is controlled to predetermined conditions, and the obtained luminance data is stored in a memory. Specifically, the temperature state is set to a predetermined temperature, the luminance of the display backlight is set to a predetermined brightness, light is illuminated at the highest illumination level within the specifications of the display device as ambient light (outside light), and sensor driving is executed in both the sensor drive mode and the second correction data acquisition mode in this state. Luminance data obtained by performing A/D conversion on panel output $V_{White}$ obtained when operating in the sensor drive mode is noted as $W_{1st.ini}$. Luminance data obtained by performing A/D conversion on panel output $V_{White}$ obtained when operating in the second correction data acquisition mode is noted as $W_{3rd.ini}$. This luminance data is also stored in the memory in the signal processing circuit 8, for example.

The following describes correction processing performed by the signal processing circuit 8 on the photosensor signal obtained in the sensor drive mode. This correction processing is performed for each pixel with use of Expression (5) below. Specifically, letting R be the luminance data obtained when the panel output from a certain pixel is subjected to A/D conversion in the signal processing circuit 8, corrected luminance data R' is obtained as follows.

$$R' = L/[\{W - (W_{3rd.ini} - W_{1st.ini})\} - \{B - (B_{2nd.ini} - B_{1st.ini})\}] \times \quad (5)$$
$$[R - \{B - (B_{2nd.ini} - B_{1st.ini})\}]$$

Note that L is the number of levels in the luminance data, and L=256 if the output of the A/D converter in the signal processing circuit 8 is 8-bit output. B is the luminance data obtained by performing A/D conversion on the first correction panel output $V_{Black}$. W is the luminance data obtained by performing A/D conversion on the second correction panel output $V_{White}$.

As described above, with the liquid crystal display device of the present embodiment, by appropriately inserting frames for the execution of sensor driving in the first correction data acquisition mode and the second correction data acquisition mode, the first correction panel output Vi lack and the second correction panel output $V_{White}$ are acquired. The signal processing circuit 8 then corrects the photosensor signal obtained in the sensor drive mode based on this output. This enables automatically correcting the photosensor signal during operation of the display device.

Furthermore, with the liquid crystal display device of the present embodiment, offset error in the first correction panel output Vi lack is resolved using $B_{2nd.ini}$ and $B_{1st.ini}$, which were acquired in an ambient environment that is controlled to predetermined conditions before factory shipment as described above. Similarly, offset error in the second correction panel output $V_{White}$ is resolved using $W_{3rd.ini}$ and $W_{1st.ini}$, which were acquired in an ambient environment that is controlled to predetermined conditions before factory shipment.

Specifically, with the correction expression disclosed in the aforementioned JP 2006-3857A, the corrected luminance data R' is obtained as shown below.

$$R'=L\times(R-B)/(W-B)$$

In contrast, in the present embodiment, as shown in Expression (5) above, the offset value $(B_{2nd.ini}-B_{1st.ini})$ is subtracted from B, and the offset value $(W_{3rd.ini}-W_{1st.ini})$ is subtracted from W. An effect of resolving the offset error is described below.

First, the resolution of offset error in the first correction panel output $V_{Black}$ will be described. As shown in FIG. 8, in the sensor drive waveforms of the present embodiment, at the time of reset (the moment when the reset signal RST switches from the high level to the low level), the readout signal RWS is at the low level in the case of the sensor drive mode, and the readout signal RWS is at the high level in the case of the first correction data acquisition mode. Accordingly, the reset field-through amount immediately after a reset is different between the case of the sensor drive mode and the case of the first correction data acquisition mode. Accordingly, the black level detected in the first correction data acquisition mode (i.e., the first correction panel output $V_{Black}$) contains a component of error from the true black level detected in the sensor drive mode.

The following is a more detailed description of the cause of error in the reset field-through amount. Specifically, the value of $V_{INT}$ immediately after a reset is expressed as shown below.

$$V_{INT}=V_{RST.H}-V_F-\Delta V_{RST} \cdot C_{PD}/C_T$$

The item $\Delta V_{RST} \cdot C_{PD}/C_T$ at the end of this expression corresponds to the reset field-through amount. Here, as described above, $C_T$ is the total capacitance of the connection point INT, which is the sum of the capacitance $C_{INT}$ of the capacitor C1, the capacitance (semiconductor junction capacitance) $C_{PD}$ of the photodiode D1, and the capacitance $C_{TFT}$ of the transistor M2.

Since the readout signal RWS is at the low level immediately after a reset in the case of the sensor drive mode, a low voltage (voltage substantially equal to $V_{RST.H}$) is applied to the photodiode D1, and therefore the capacitance $C_{PD}$ is low, and the capacitance $C_{TFT}$ of the transistor M2 is also the off-time capacitance. On the other hand, since the readout signal RWS is at the high level immediately after a reset in the case of the first correction data acquisition mode, a high voltage is applied to the photodiode D1, and therefore the capacitance $C_{PD}$ is high, and the capacitance $C_{TFT}$ of the transistor M2 is also the on-time capacitance. In this way, the value of $C_T$ immediately after a reset is different between the sensor drive mode and the first correction data acquisition mode, and therefore error appears in the reset field-through amount. As a result, the black level detected in the first correction data acquisition mode contains offset error with respect to the true black level detected in the sensor drive mode.

Note that this offset error can be corrected using the above-described $B_{2nd.ini}$ and $B_{1st.ini}$. Specifically, $B_{2nd.ini}$ is the black level detected in the first correction data acquisition mode in an ambient environment that is controlled to predetermined conditions. $B_{1st.ini}$ is the black level detected in the sensor drive mode under the same conditions. Accordingly, by subtracting the offset error between $B_{2nd.ini}$ and $B_{1st.ini}$ from B as shown in Expression (5) above, it is possible to cancel out error in the reset feed-through amount. Accordingly, deviation in image luminance is suppressed, and highly precise sensor output can be obtained.

Figure 10:
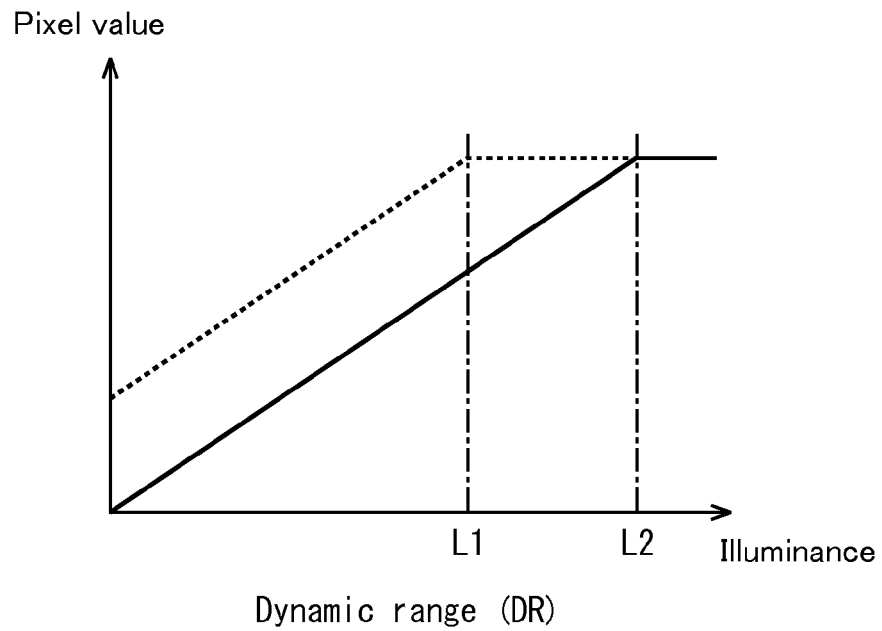
FIG. 10 is a graph showing differences in dynamic range in the case where offset error between $B_{2nd.ini}$ and $B_{1st.ini}$ is not resolved, and the case where it is resolved.

Also, the present embodiment also obtains an effect of increasing the dynamic range of the sensor output. FIG. 10 is a graph showing differences in dynamic range in the case where the offset error between $B_{2nd.ini}$ and $B_{1st.ini}$ is not resolved, and the case where it is resolved. As shown in FIG. 10, in the case where there is offset error between the black level detected in the first correction data acquisition mode (i.e., the first correction panel output $V_{Black}$) and the true black level, the change in the pixel value (luminance data) relative to illuminance is shown by the broken line in this figure. Note that this offset error corresponds to the difference between $B_{2nd.ini}$ and $B_{1st.ini}$. In this case, the pixel value becomes saturated when the illuminance reaches L1 as shown by the broken line in FIG. 10. In other words, it can be seen that the dynamic range decreases as the offset error increases. In view of this, resolving this offset error has the effect of raising the illuminance at which the pixel value becomes saturated to L2 as shown by the solid line in FIG. 10, thus making it possible to increase the dynamic range.

Next, the resolution of offset error in the second correction panel output $V_{White}$ will be described.

In the case of the sensor drive mode and the second correction data acquisition mode as well, the difference between drive timings causes error to appear between the white level obtained in the second correction data acquisition mode and the true white level obtained in the sensor drive mode.

Causes for the error in the white level between the sensor drive mode and second correction data acquisition mode include, for example, (a) the presence or absence of a reset feed-through amount, (b) a difference in the reset level due to coupling with a source line and fluctuation in the source line potential, (c) a difference in the source line potential at the timing at which readout is performed, and (d) a difference in the reset level due to fluctuation in the potential $V_{SS}$.

For example, in the case of (a), although there is reset feed-through in the sensor drive mode, the reset signal is at the high level in the second correction data acquisition mode, and therefore there is no reset field-through. Accordingly, error arises due to the presence or absence of reset field-through in these modes.

Also, in the case of (b), the source line potential at the time of a reset is different between the sensor drive mode and the second correction data acquisition mode, and therefore the reset level of the sensor circuit is different due to coupling with a source line. Error in the white level between these modes appears due to this difference in the reset level.

Also, in the case of (c), the timing at which readout is performed is different between the sensor drive mode and the second correction data acquisition mode, and the source line potential immediately before readout is also different. This difference in the source line potential is also a cause of error in the white level between these modes.

Also, in the case of (d), the reset level is influenced by fluctuation in the potential $V_{SS}$ in the sensor drive mode, but is not influenced in the second correction data acquisition mode, thus causing a difference in the reset level between these modes. This difference in the reset level is also a cause of error in the white level.

Figure 11:
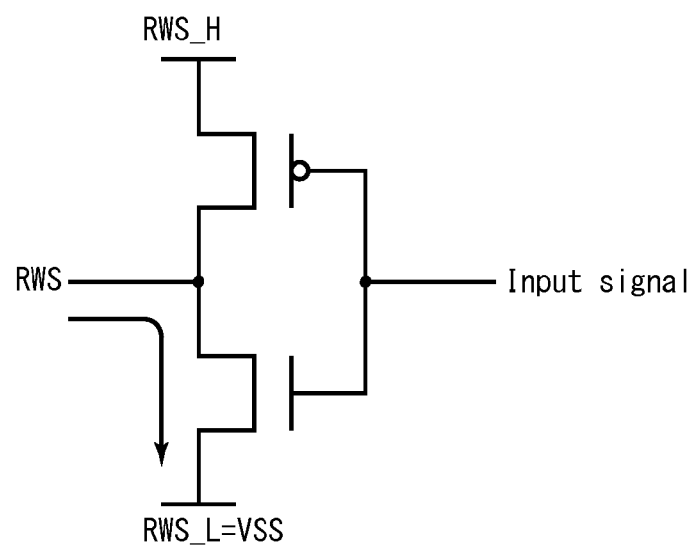
FIG. 11 is an equivalent circuit diagram showing an example of a configuration of an RWS driver circuit that generates a readout signal RWS.
Figure 15A:
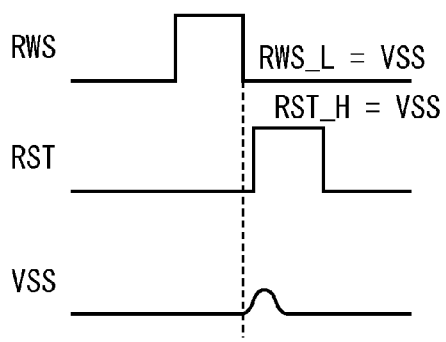
FIG. 15A is a waveform diagram showing the potential of a readout signal RWS, a reset signal RST, and wiring VSS in a sensor drive mode of the display device according to Embodiment 2.

In other words, in the sensor drive mode, when the readout signal RWS switches from the high level to the low level, current flows to the wiring VSS via the sensor readout circuit, and the influence of the wiring resistance of the power supply causes floating in the potential of the wiring VSS, which should originally be the constant potential $V_{SS}$ (see later-described FIG. 15A as well). FIG. 11 is an equivalent circuit diagram showing an example of a configuration of the RWS driver circuit that generates the readout signal RWS. As shown in FIG. 11, when the readout signal RWS has switched from the high level $V_{RWS.H}$ to the low level $V_{RWS.L}$, a current flows to the wiring VSS that provides the low level $V_{RWS.L}$ of the readout signal RWS, and the potential of the wiring VSS floats due to the influence of parasitic resistance.

The wiring VSS provides not only the low level $V_{RWS.L}$ of the readout signal RWS, but also the potential of the high level $V_{RST.H}$ of the reset signal RST. Accordingly, the floating of the potential of the wiring VSS in the sensor drive mode influences the potential of the reset signal, which in turn influences the reset state (reset level) of the potential $V_{INT}$ at the connection point INT as well. On the other hand, in the case of the second correction data acquisition mode, the level of the readout signal RWS is constant, and therefore the potential of the wiring VSS does not float, and the reset state is not influenced.

Error in the white level that appears due to various causes such as those described above can be corrected using Expression (5). Specifically, in an ambient environment that is controlled to predetermined conditions before factory shipment, the difference between $W_{3rd.ini}$ and $W_{1st.ini}$, which were acquired in the third mode and the sensor drive mode shown in FIG. 12, is subtracted from W, thus making it possible to resolve offset error in the white level.

Note that the present embodiment has described an example of, as shown in Expression (5), resolving offset error in both the first correction panel output $V_{Black}$ (in Expression (5), luminance data B obtained by subjecting this panel output to A/D conversion) and the second correction panel output $V_{White}$ (in Expression (5), luminance data W obtained by subjecting this panel output to A/D conversion). However, a configuration is possible in which offset error is resolved in only either one of the first correction panel output $V_{Black}$ and the second correction panel output $V_{White}$.

Specifically, in the case of resolving offset error in only the first correction panel output $V_{Black}$, the corrected luminance data R' is obtained using Expression (6) below.

$$R'=R-\{B-(B_{2nd.ini}-B_{1st.ini})\} \qquad (6)$$

Also, in the case of resolving offset error in only the second correction panel output $V_{White}$, the corrected luminance data R' is obtained using Expression (7) below.

$$R'=L \times R/\{W-(W_{3rd.ini}-W_{1st.ini})-B_{1st.ini}\} \qquad (7)$$

Embodiment 2

Below is a description of Embodiment 2 of the present invention. Note that the same reference numerals have been used for constituent elements that have functions likewise to those of the constituent elements described in Embodiment 1, and detailed descriptions thereof have been omitted.

The configuration of the liquid crystal display device of the present embodiment is the same as that of the liquid crystal display device of Embodiment 1, but differs from Embodiment 1 with respect to the patterns of the sensor drive signals.

FIG. 12 is a waveform diagram showing the patterns of the reset signal and the readout signal in the respective modes in the present embodiment. As shown in FIG. 12, in the present embodiment, the reset signal rises to the high level after the readout signal has switched from the high level to the low level. Also, in the example in FIG. 12, in the sensor drive mode and the first correction data acquisition mode, the period for which the readout signal is at the high level and the period for which the reset signal is at the high level do not overlap with each other. Specifically, in the sensor drive mode, the reset signal rises to the high level after the readout signal has switched from the high level to the low level. In the first correction data acquisition mode, the readout signal rises to the high level after the reset signal has switched from the high level to the low level. In the second correction data acquisition mode, the timing at which the reset signal rises to the high level is the same as that in the sensor drive mode.

Figure 13A:
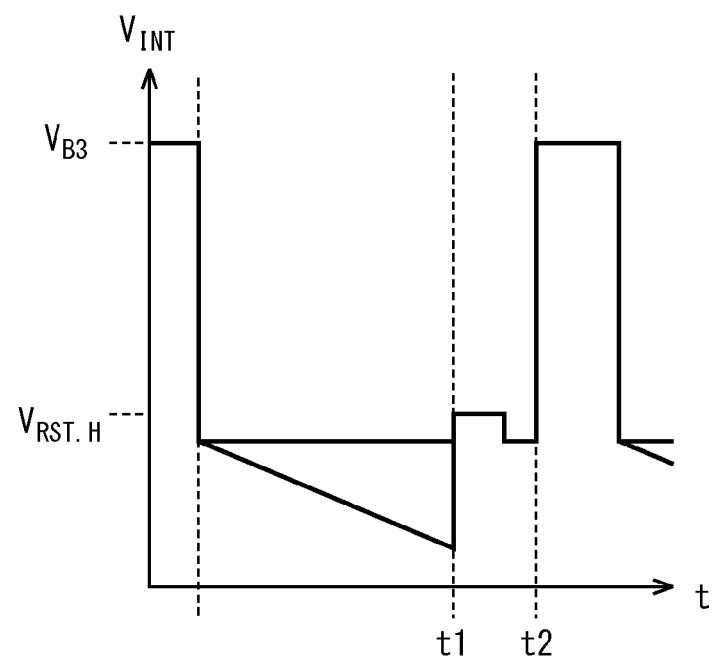
FIG. 13A is a waveform diagram of $V_{INT}$ in the first correction data acquisition mode shown in FIG. 12.
Figure 13B:
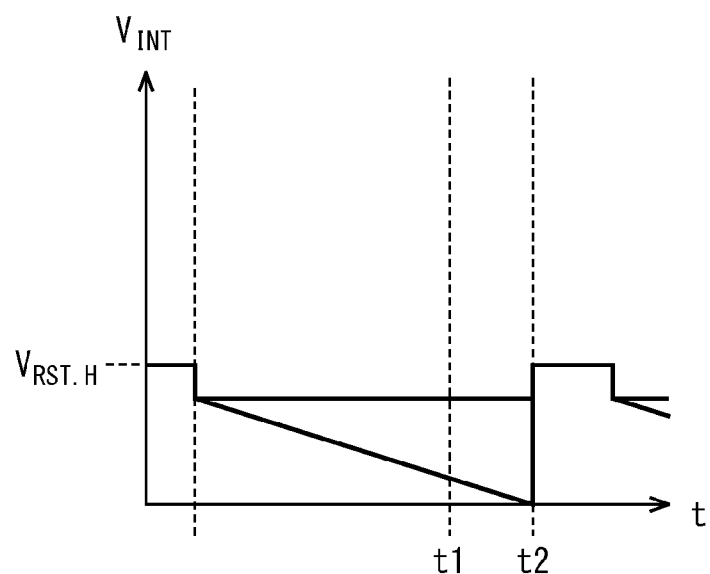
FIG. 13B is a waveform diagram of $V_{INT}$ in the second correction data acquisition mode shown in FIG. 12.

In the first correction data acquisition mode shown in FIG. 12, the readout signal has not yet risen to the high level in the period from the time when the reset signal switches from the high level to the low level to the time t2, and therefore as shown in FIG. 13A, the potential $V_{INT}$ drops from the reset level ($V_{RST.H}$) in accordance with the charging of the parasitic capacitance of the photodiode D1. During this period, the potential $V_{INT}$ is lower than the threshold voltage of the transistor M2, and therefore the transistor M2 is off. When the readout signal then rises to the high level at the time t2, sensor output $V_{B3}$ corresponding to the black level of the photosensor is read out, and the value of panel output $V_{OUT}$ that is based on the sensor output $V_{B3}$ is used as the first correction panel output $V_{Black}$ for the correction of panel output.

In the second correction data acquisition mode shown in FIG. 12, the potential of the readout signal RWS is always zero. Accordingly, sensor output that corresponds to the white level of the photosensor is read out as the potential $V_{INT}$. The value of panel output $V_{OUT}$ that is based on this sensor output is used as the second correction panel output $V_{White}$ for the correction of panel output.

Also, similarly to Embodiment 1, in the present embodiment as well, offset error in the first correction panel output $V_{Black}$ is resolved using $B_{2nd.ini}$ and $B_{1st.ini}$, which were acquired in the first correction data acquisition mode and the sensor drive mode shown in FIG. 12 in an ambient environment that is controlled to predetermined conditions before factory shipment. Also, offset error in the second correction panel output $V_{White}$ is resolved using $W_{3rd.ini}$ and $W_{1st.ini}$, which were acquired in the second correction data acquisition mode and the sensor drive mode shown in FIG. 12 in an ambient environment that is controlled to predetermined conditions before factory shipment. Note that the correction expressions used here are the same as Expressions (5), (6), or (7) that are described in Embodiment 1. This enables resolving offset error as well as obtaining sensor output having an increased dynamic range.

Note that it is desirable that the signal supplied to the source line is set to a constant potential when acquiring the above-described data. Specifically, it is desirable that an arbitrary gray level is displayed such that the source potential is constant throughout the driving in the respective modes.

An effect of resolving the offset error is described below.

First, the resolution of offset error in the first correction panel output $V_{Black}$ will be described.

Figure 14:
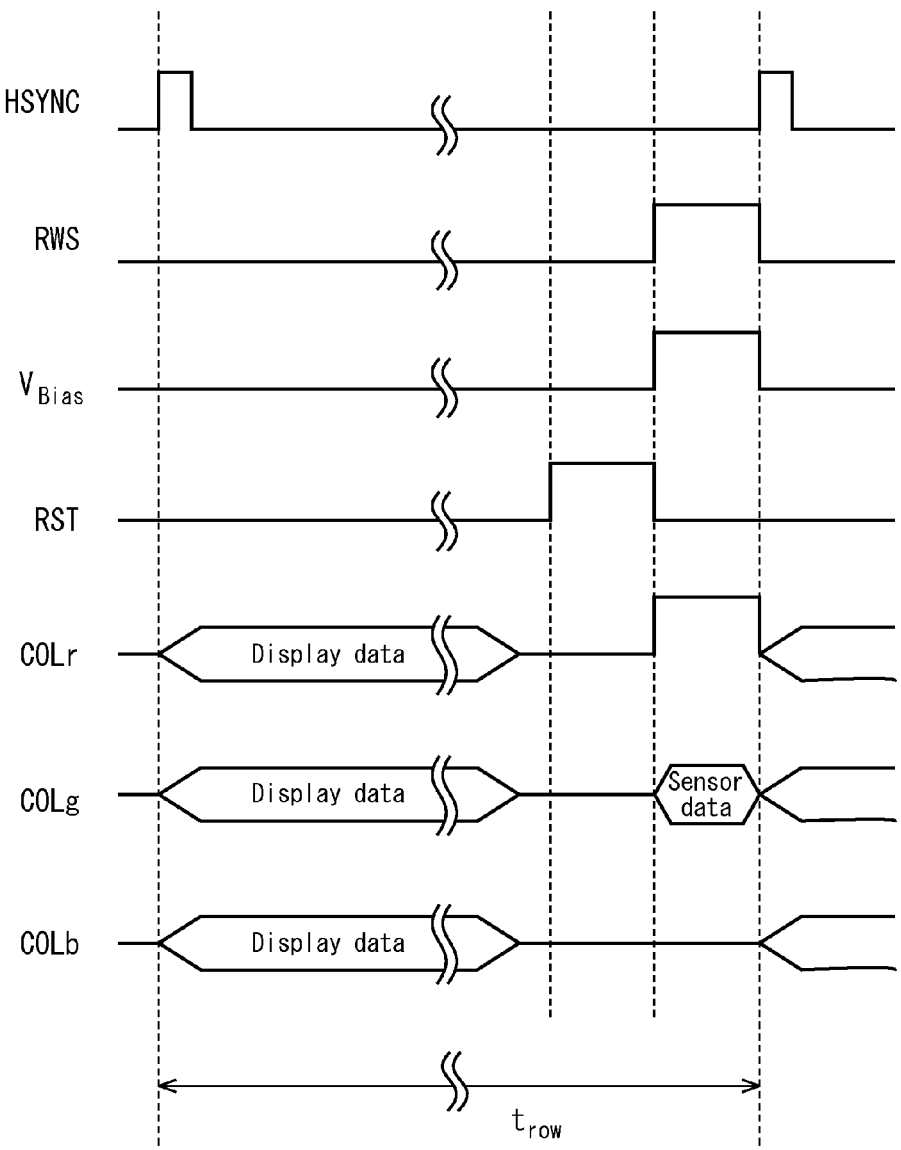
FIG. 14 is timing chart showing sensor drive timing in the first correction data acquisition mode of the display device according to Embodiment 2.

In the case of the present embodiment, as shown in FIG. 12, the order of resetting and readout is switched in the sensor drive mode and the first correction data acquisition mode. The connection point INT has a coupling capacitance between it and the source lines COL, and a cause for offset error is that the source line potential at the time of a reset has a value that differs depending on the drive timing (order of resetting and readout). Specifically, at the time of a reset, in the case of the sensor drive mode, the potential of the source lines COL is the potential of the sensor data as shown in FIG. 4. On the other hand, in the case of the first correction data acquisition mode, the potential of the source lines COL at the time of a reset is the potential of the display data as shown in FIG. 14. Accordingly, the source line potential has different values in the case of the sensor drive mode and the case of the first correction data acquisition mode, and a difference in the level of the reset signal RST arises due to the coupling capacitance between the connection point INT and the source lines COL.

There are also causes for fluctuation such as the following since the order of resetting and readout is opposite in the case of the sensor drive mode and the case of the first correction data acquisition mode. Specifically, as shown in FIG. 15A, when the readout signal RWS switches from the high level to the low level in the sensor drive mode, a current flows to the wiring VSS via the RWS driver circuit shown in FIG. 11, and the potential of the wiring VSS, which should originally be the constant potential $V_{SS}$, floats due to the influence of the wiring resistance of the power supply or the like as shown in FIG. 15A.

Figure 15B:
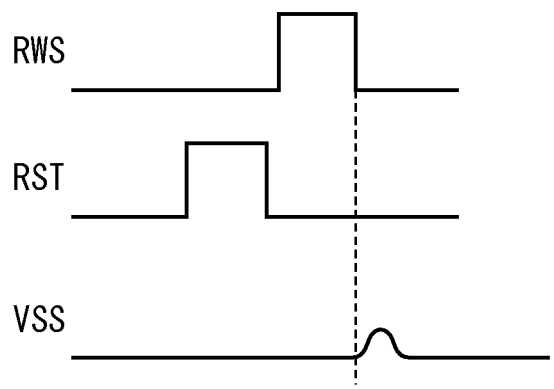
FIG. 15B is a waveform diagram showing the potential of the readout signal RWS, the reset signal RST, and the wiring VSS in the first correction data acquisition mode according to Embodiment 2.

Note that as described above, this wiring VSS provides not only the low level $V_{RWS.L}$ of the readout signal RWS, but also the potential of the high level $V_{RST.H}$ of the reset signal RST. Accordingly, the floating of the potential of the wiring VSS in the sensor drive mode influences the potential of the reset signal, which in turn influences the reset state of the potential $V_{INT}$ at the connection point INT as well. On the other hand, in the case of the first correction data acquisition mode, as shown in FIG. 15B, the floating of the potential of the wiring VSS when the readout signal RWS switches from the high level to the low level has no influence on the potential of the reset signal.

Also, since the readout timing is also different in the case of the sensor drive mode and the case of the first correction data acquisition mode, the potential of the source lines COL also differs, and a difference arises in the readout voltage as well. This difference in the readout voltage is also a cause for offset error. For these reasons, the black level obtained in the first correction data acquisition mode includes offset error from the true black level that is read out in the sensor drive mode.

Note that in the present embodiment as well, the offset error is resolved by subtracting the difference between $B_{2nd.ini}$ and $B_{1st.ini}$, which were acquired in the first correction data acquisition mode and the sensor drive mode shown in FIG. 12, from B in an ambient environment that is controlled to predetermined conditions before factory shipment, using Expressions (5) and (6) that are described in Embodiment 1. Accordingly, deviation in image luminance is suppressed, and highly precise sensor output can be obtained. Also, resolving the offset error also has an effect of increasing the dynamic range of the sensor output as described with reference to FIG. 10 in Embodiment 1.

Also, due to the various causes described in Embodiment 1, a difference arises between the white level obtained in the second correction data acquisition mode and the true white level obtained in the sensor drive mode. Accordingly, in the present embodiment as well, the offset error in the white level is resolved by subtracting the difference between $W_{3rd.ini}$ and $W_{1st.ini}$, which were acquired in the third mode and the sensor drive mode shown in FIG. 12, from W in an ambient environment that is controlled to predetermined conditions before factory shipment, using Expressions (5) and (7) that are described in Embodiment 1.

Note that in Embodiment 1 and Embodiment 2, the sensor drive signal patterns shown in FIGS. 8 and 12 are used in frames that are mutually independent in all of the modes, and therefore the patterns in the modes can be used in arbitrary combinations. For example, it is possible to use a combination of the sensor drive signal patterns in the sensor drive mode shown in FIG. 8 and the sensor signal patterns in the first or second correction data acquisition mode shown in FIG. 12, or to use a combination of the sensor drive signal patterns in the sensor drive mode and the second correction data acquisition mode shown in FIG. 8 and the sensor drive signal patterns in the first correction data acquisition mode shown in FIG. 12.

Embodiment 3

Below is a description of a display device according to Embodiment 3 of the present invention. Note that the same reference numerals have been used for constituent elements that have functions likewise to those of the constituent elements described in Embodiment 1, and detailed descriptions thereof have been omitted.

Figure 17A:
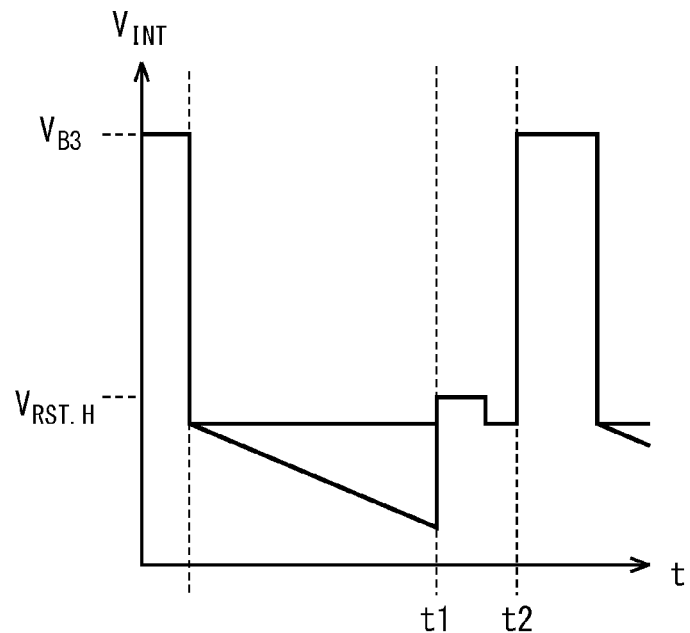
FIG. 17A is a waveform diagram of $V_{INT}$ in the first correction data acquisition mode of the display device according to Embodiment 3.
Figure 17B:
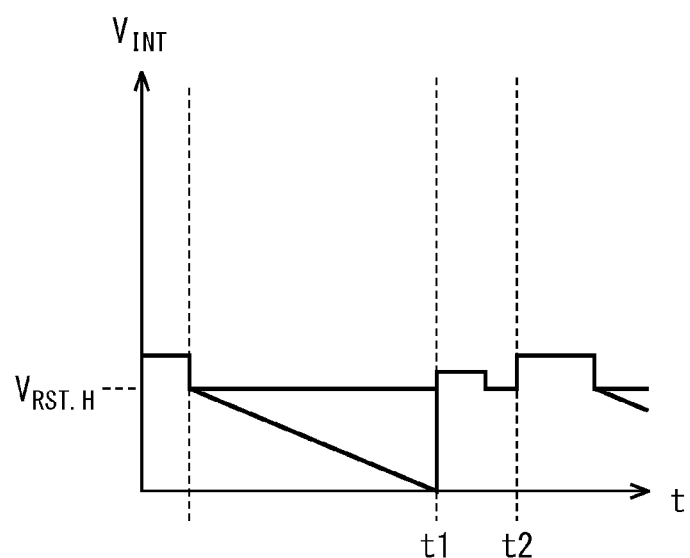
FIG. 17B is a waveform diagram of $V_{INT}$ in the second correction data acquisition mode according to Embodiment 3.

FIG. 16 is a waveform diagram showing patterns of the reset signal and the readout signal in respective modes of the display device according to Embodiment 3. FIGS. 17A and 17B are waveform diagrams showing transition in the potential $V_{INT}$ of the connection point INT in the first and second correction data acquisition modes respectively.

In the second correction data acquisition mode of the display device of the present embodiment, a readout pulse whose amplitude is lower than that of the readout signal in the sensor drive mode is applied at the same as the reset signal rises to the high level as shown in FIG. 16. Other aspects of the configuration and operation of the display device of Embodiment 3 are the same as those of the display device of Embodiment 2. Specifically, as shown in FIG. 16, the waveforms of the reset signal and the readout signal in the sensor drive mode and the first correction data acquisition mode of the display device of Embodiment 3 are the same as the patterns of Embodiment 2 shown in FIG. 12. Accordingly, transition in the potential $V_{INT}$ of the connection point INT in the first correction data acquisition mode shown in FIG. 17A is the same as that in FIG. 13A.

In the present embodiment, the amplitude $\Delta V_{RWS.BLACK}$ of the readout signal in the first correction data acquisition mode and the amplitude $\Delta V_{RWS.WHITE}$ of the readout signal in the second correction data acquisition mode are respectively expressed by Expressions (8) and (9) below.

$$\Delta V_{RWS.BLACK} = V_{RWS.H} - V_{RWS.L} \tag{8}$$

$$\Delta V_{RWS.WHITE} = \tag{9}$$
$$(V_{RWS.H} - V_{RWS.L}) + (V_F - \Delta V_{RST}) \cdot C_T / C_{INT} + \Delta V_{RST} \cdot C_{PD} / C_{INT}$$

Note that the value of $\Delta V_{RWS.WHITE}$ is set according to steps (1) to (3) below in the final stage of the display device manufacturing process.

(1) First, while the photosensor of the display device is driven in the sensor drive mode, the pixel region 1 is irradiated with the maximum illuminance level of light within the specifications of the display device, and the panel output $V_{OUT}$ is acquired in this state. In other words, $V_{OUT}$ that is acquired here is panel output at the time when the white level is saturated (i.e., the state in which the amount of shift in the capacitance output of the photosensor is saturated).

(2) Next, the second correction panel output $V_{White}$ is acquired while the photosensor is driven in the second correction data acquisition mode. The level of $\Delta V_{RWS.WHITE}$ is then adjusted such that the value of the panel output $V_{White}$ at this time is equal to the panel output acquired in (1).

(3) Lastly, the adjusted value of $\Delta V_{RWS.WHITE}$ obtained in (2) is recorded in a memory such as an EEPROM that can be referenced by the sensor row driver 5.

Note that the value of $\Delta V_{RWS.WHITE}$ can be logically expressed by the following mathematical expression. First, Expression (10) below expresses the potential $V_{INT}$ of the connection point INT in the case of applying the readout pulse after the reset pulse as shown in FIGS. 16 and 17B in the second correction data acquisition mode.

$$V_{INT} = V_{RST.H} - V_F - \Delta V_{RST} \cdot C_{PD} / C_T + \Delta V_{RWS.WHITE} \cdot C_{INT} / C_T \tag{10}$$

Here, Expression (11) below expresses the potential $V_{INT}$ of the connection point INT in the case where the sensor output was at the saturation level (white) in the sensor drive mode.

$$V_{INT} = V_{RST.L} + (V_{RWS.H} - V_{RWS.L}) \cdot C_{INT}/C_T \tag{11}$$

Accordingly, in order to obtain the panel output $V_{OUT}$ that corresponds to the white saturation level in the second correction data acquisition mode, $\Delta V_{RWS.WHITE}$ needs only be determined such that the values of $V_{INT}$ in Expression (10) and $V_{INT}$ in Expression (11) are equal to each other. Accordingly, Expression (12) below obtains the above-describe Expression (9) regarding $\Delta V_{RWS.WHITE}$.

$$V_{RST.H} - V_F - \Delta V_{RST} \cdot C_{PD} / C_T + \Delta V_{RWS.WHITE} \cdot C_{INT}/C_T = \tag{12}$$
$$V_{RST.L} + (V_{RWS.H} - V_{RWS.L}) \cdot C_{INT} / C_T$$

Expression (13) below expresses the potential $V_{INT}$ of the connection point INT when the readout signal has risen to the high level in the first correction data acquisition mode. Since this potential $V_{INT}$ is higher than the threshold voltage of the transistor M2, the transistor M2 enters the conductive state, and panel output $V_{OUT}$ that corresponds to the sensor output $V_{SOUT}$ from the photosensor is obtained. The value of the panel output $V_{OUT}$ obtained at this time is used as the first correction panel output $V_{Black}$ for the correction of panel output.

$$V_{INT} = V_{RST.H} - V_F - \Delta V_{RST} \cdot C_{PD}/C_T + \Delta V_{RWS.BLACK} \cdot C_{INT}/C_T \tag{13}$$

Also, the above-described Expression (10) expresses the potential $V_{INT}$ of the connection point INT when the readout signal has risen to the high level in the second correction data acquisition mode. Since the potential $V_{INT}$ in Expression (10) is higher than the threshold voltage of the transistor M2, the transistor M2 enters the conductive state, and panel output $V_{OUT}$ that corresponds to the sensor output $V_{SOUT}$ from the photosensor is obtained. The value of the panel output $V_{OUT}$ obtained at this time is used as the second correction panel output $V_{White}$ for the correction of panel output.

Similarly to Embodiment 1, the signal processing circuit 8 corrects the photosensor signal obtained in the sensor drive mode, using $V_{Black}$ and $V_{White}$ that were obtained in the first correction data acquisition mode and the second correction data acquisition mode. As described above, a photosensor signal can be automatically corrected during operation of the display device of the present embodiment as well.

Also, in the present embodiment as well, by using Expressions (5) to (7) to correct offset error in at least one of $V_{Black}$ (i.e., luminance data B obtained by subjecting it to A/D conversion) and $V_{White}$ (i.e., W obtained by subjecting it to A/D conversion) that were obtained in the first correction data acquisition mode and the second correction data acquisition mode, it is possible to suppress deviation in image luminance and to obtain highly precise sensor output. Also, resolving the offset error also has an effect of increasing the dynamic range of the sensor output as described with reference to FIG. 10 in Embodiment 1.

Note that the second correction data acquisition mode in Embodiment 3 is different from the second correction data acquisition mode in Embodiments 1 and 2 as follows.

Specifically, with the second correction data acquisition mode in Embodiment 1, the transistor M2 remains in the non-conducting state since the readout signal is always at the low level, and the value of the panel output $V_{OUT}$ is a value that does not at all reflect the light reception state of the photodiode D1, and only represents offset originating from circuit elements other than the photodiode D1.

On the other hand, with the second correction data acquisition mode in Embodiment 3, the readout pulse that is applied after the reset pulse has the amplitude $\Delta V_{RWS.WHITE}$, which is greater than zero and less than the amplitude of the readout signal in the sensor drive mode and the first correction data acquisition mode. As described above, this value of $\Delta V_{RWS.WHITE}$ is determined such that $V_{White}$ that is obtained corresponds to the panel output $V_{OUT}$ in the case where the sensor output from the photosensor in the sensor drive mode is at the white saturation level.

Accordingly, Embodiment 3 enables correcting the photosensor signal using $V_{White}$ that corresponds to the white saturation level, thus making it possible to accurately correct not only the offset, but also the gain. Embodiment 3 has a more advantageous effect than Embodiments 1 and 2 in this aspect.

Note that the correction amount $\Delta V_{RWS.WHITE}$ used in the present embodiment is a correction amount for performing adjustment in order to obtain uniformity in the panel face, and it is not possible for this adjustment to correct variation in individual sensors. In contrast, variation in individual sensors can be highly precisely corrected by additionally performing correction using $V_{Black}$ and $V_{White}$ that were obtained in the first correction data acquisition mode and the second correction data acquisition mode as described above.

Although the present invention has been described based on Embodiments 1 to 3, the present invention is not limited to only the above-described embodiments, and it is possible to make various changes within the scope of the invention.

Figure 18:
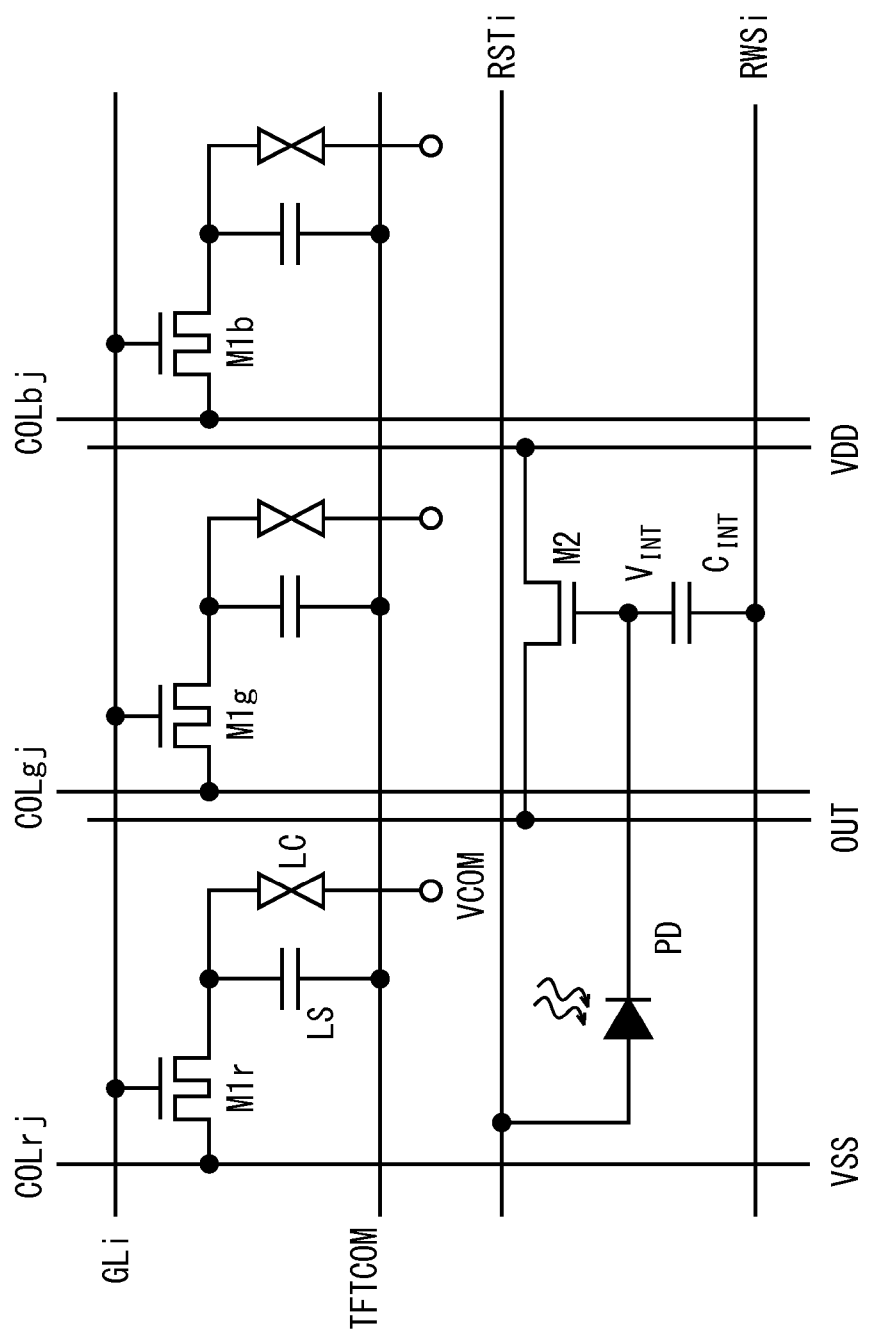
FIG. 18 is an equivalent circuit diagram showing a configuration in which wiring VDD and OUT of a photosensor are provided separately from source wiring COL, as an example of a variation of a display device according to an embodiment of the present invention.

For example, Embodiments 1 to 3 describe an example of a configuration in which the wiring VDD and OUT that the photosensor is connected to are also used as the source wiring COL. This configuration has the advantage that the pixel aperture ratio is high. However, even with a configuration in which the photosensor wiring VDD and OUT are provided separately from the source wiring COL as shown in FIG. 18, it is possible to achieve effects similar to those in the above-described Embodiments 1 to 3, that is to say, the photosensor signal can be automatically corrected during operation of the display device by performing sensor driving that is similar to that of the above-described embodiments.

INDUSTRIAL APPLICABILITY

The present invention is industrially applicable as a display device with an image pick-up function that has a photosensor in a pixel, particularly a display device in which panel output can be corrected during operation of the display device.

The invention claimed is:

1. A display device provided with an active matrix substrate, the display device comprising:
   a photosensor provided in a pixel region of the active matrix substrate;
   sensor drive wiring connected to the photosensor;
   a sensor driver circuit that supplies a sensor drive signal to the photosensor via the sensor drive wiring;
   an amplifier circuit that amplifies sensor output that was read out from the photosensor in accordance with the sensor drive signal, and outputs the sensor output as a photosensor signal; and
   a signal processing circuit that processes the photosensor signal that was output from the amplifier circuit,
   wherein operation modes of the sensor driver circuit include at least
   a sensor drive mode in which a sensor drive signal of a first pattern is supplied to the photosensor, and thus a photosensor signal that corresponds to the amount of light received by the photosensor is output to the signal processing circuit, and
   a correction data acquisition mode in which a sensor drive signal of a second pattern that is different from the first pattern is supplied to the photosensor, and thus a correction photosensor signal level that corresponds to a case where the photosensor detected a black level or a white level is acquired,
   the display device further comprises a memory that stores, as data for resolving offset in the correction photosensor signal level, a photosensor signal level that was obtained by driving the photosensor in each of the sensor drive mode and the correction data acquisition mode in an ambient environment that is controlled to a predetermined condition, and
   the signal processing circuit corrects the photosensor signal in the sensor drive mode using the correction photosensor signal level that was corrected using the data for resolving offset that was read out from the memory
   wherein the sensor drive wiring includes reset signal wiring that is connected to the photosensor and readout signal wiring that is connected to the photosensor,
   the sensor drive signal includes a reset signal that is supplied to the photosensor via the reset signal wiring and a readout signal that is supplied to the photosensor via the readout signal wiring,
   in the sensor drive mode, the sensor driver circuit supplies the photosensor with the reset signal, and then with the readout signal after a predetermined time period has elapsed, and thus a photosensor signal that corresponds to the amount of light received by the photosensor in the predetermined time period is output to the signal processing circuit,
   the correction data acquisition mode includes a first correction data acquisition mode in which the readout signal is supplied from the sensor driver circuit to the photosensor at a time that is after the start of the supply of the reset signal and before the end of the supply of the reset signal, and thus a first correction photosensor signal level B that corresponds to a case where the photosensor detected a black level is acquired, and
   in an ambient environment that is controlled to a predetermined condition, letting $B_{1st.ini}$ be the photosensor signal level stored in the memory that was obtained by driving the photosensor in the sensor drive mode, and $B_{2nd.ini}$ be the photosensor signal level stored in the memory that was obtained by driving the photosensor in the first correction data acquisition mode,
   the signal processing circuit obtains a corrected photosensor signal R' from a photosensor signal R in the sensor drive mode as follows:

$$R'=R-\{B-(B_{2nd.ini}-B_{1st.ini})\}.$$

2. The display device according to claim 1,
   wherein the correction data acquisition mode includes a first correction data acquisition mode in which the readout signal is supplied from the sensor driver circuit to the photosensor at a time that is after the start of the supply of the reset signal and after the end of the supply of the reset signal, and thus a first correction photosensor signal level B that corresponds to a case where the photosensor detected a black level is acquired, and
   in an ambient environment that is controlled to a predetermined condition, letting $B_{1st.ini}$ be the photosensor signal level stored in the memory that was obtained by driving the photosensor in the sensor drive mode, and $B_{2nd.ini}$ be the photosensor signal level stored in the memory that was obtained by driving the photosensor in the first correction data acquisition mode,
   the signal processing circuit obtains a corrected photosensor signal R' from a photosensor signal R in the sensor drive mode as follows:

$$R'=R-\{B-(B_{2nd.ini}-B_{1st.ini})\}.$$

3. The display device according to claim 1,
   wherein the correction data acquisition mode includes a second correction data acquisition mode in which the sensor driver circuit supplies a readout signal whose amplitude is zero, and thus a second correction photosensor signal level W that corresponds to a case where the photosensor detected a white level is acquired, and in an ambient environment that is controlled to a predetermined condition, letting $B_{1st.ini}$ be the photosensor signal level stored in the memory that was obtained by driving the photosensor in the sensor drive mode, and in an ambient environment that is controlled to a predetermined condition, letting $W_{1st.ini}$ be the photosensor signal level stored in the memory that was obtained by driving the photosensor in the sensor drive mode, $W_{3rd.ini}$ be the photosensor signal level stored in the memory that was obtained by driving the photosensor in the second correction data acquisition mode, and L be the number of photosensor signal levels, the signal processing circuit obtains a corrected photosensor signal R' from a photosensor signal R in the sensor drive mode as follows:

$$R' = L \times R / \{W - (W_{3rd.ini} - W_{1st.ini}) - B_{1st.ini}\}.$$

4. The display device according to claim 1, wherein the correction data acquisition mode includes a first correction data acquisition mode in which the readout signal is supplied from the sensor driver circuit to the photosensor at a time that is after the start of the supply of the reset signal and after the end of the supply of the reset signal, and thus a first correction photosensor signal level B that corresponds to a case where the photosensor detected a black level is acquired, and a second correction data acquisition mode in which the sensor driver circuit supplies a readout signal whose amplitude is zero, and thus a second correction photosensor signal level W that corresponds to a case where the photosensor detected a white level is acquired, and in an ambient environment that is controlled to a predetermined condition, letting $B_{1st.ini}$ be the photosensor signal level stored in the memory that was obtained by driving the photosensor in the sensor drive mode, and $B_{2nd.ini}$ be the photosensor signal level stored in the memory that was obtained by driving the photosensor in the first correction data acquisition mode, and in an ambient environment that is controlled to a predetermined condition, letting $W_{1st.ini}$ be the photosensor signal level stored in the memory that was obtained by driving the photosensor in the sensor drive mode, $W_{3rd.ini}$ be the photosensor signal level stored in the memory that was obtained by driving the photosensor in the second correction data acquisition mode, and L be the number of photosensor signal levels, the signal processing circuit obtains a corrected photosensor signal R' from a photosensor signal R in the sensor drive mode as follows:

$$R' = L / [\{W - (W_{3rd.ini} - W_{1st.ini})\} - \{B - (B_{2nd.ini} - B_{1st.ini})\}] \times [R - \{B - (B_{2nd.ini} - B_{1st.ini})\}].$$

5. The display device according to claim 1, wherein the correction data acquisition mode includes a second correction data acquisition mode in which the sensor driver circuit supplies, in synchronization with the reset signal, a readout signal whose amplitude is $\Delta V_{RWS.WHITE}$ for reading out sensor output that corresponds to a state in which the amount of shift in capacitance output of the photosensor is saturated, and thus a second correction photosensor signal level W that corresponds to a case where the photosensor detected a white level is acquired, and in an ambient environment that is controlled to a predetermined condition, letting $W_{1st.ini}$ be the photosensor signal level stored in the memory that was obtained by driving the photosensor in the sensor drive mode, $W_{3rd.ini}$ be the photosensor signal level stored in the memory that was obtained by driving the photosensor in the second correction data acquisition mode, and L be the number of photosensor signal levels, and in an ambient environment that is controlled to a predetermined condition, letting $B_{1st.ini}$ be the photosensor signal level stored in the memory that was obtained by driving the photosensor in the sensor drive mode, the signal processing circuit obtains a corrected photosensor signal R' from a photosensor signal R in the sensor drive mode as follows:

$$R' = L \times R / \{W - (W_{3rd.ini} - W_{1st.ini}) - B_{1st.ini}\}.$$

6. The display device according to claim 5, wherein the photosensor includes one photodiode and a capacitor that is connected to a cathode of the photodiode, and the amplitude $\Delta V_{RWS.WHITE}$ of the readout signal is obtained by the following expression:

$$\Delta V_{RWS.WHITE} = (V_{RWS.H} - V_{RWS.L}) + (V_F - \Delta V_{RST}) \cdot C_T / C_{INT} + \Delta V_{RST} \cdot C_{PD} / C_{INT}$$

$$\Delta V_{RST} = V_{RST.H} - V_{RST.L}$$

$V_{RWS.H}$ being the high level potential of the readout signal in the sensor drive mode, $V_{RWS.L}$ being the low level potential of the readout signal in the sensor drive mode, $V_F$ being the forward voltage of the photodiode, $V_{RST.H}$ being the high level potential of the reset signal, $V_{RST.L}$ being the low level potential of the reset signal, $C_T$ being the capacitance of a connection point between the photodiode and the capacitor, $C_{PD}$ being the capacitance of the photodiode, and $C_{INT}$ being the capacitance of the capacitor.

7. The display device according to claim 1, wherein the correction data acquisition mode includes a first correction data acquisition mode in which the readout signal is supplied from the sensor driver circuit to the photosensor at a time that is after the start of the supply of the reset signal and after the end of the supply of the reset signal, and thus a first correction photosensor signal level B that corresponds to a case where the photosensor detected a black level is acquired, and a second correction data acquisition mode in which the sensor driver circuit supplies, in synchronization with the reset signal, a readout signal whose amplitude is $\Delta V_{RWS.WHITE}$ for reading out sensor output that corresponds to a state in which the amount of shift in capacitance output of the photosensor is saturated, and thus a second correction photosensor signal level W that corresponds to a case where the photosensor detected a white level is acquired, and in an ambient environment that is controlled to a predetermined condition, letting $B_{1st.ini}$ be the photosensor signal level stored in the memory that was obtained by driving the photosensor in the sensor drive mode, and $B_{2nd.ini}$ be the photosensor signal level stored in the memory that was obtained by driving the photosensor in the first correction data acquisition mode, in an ambient environment that is controlled to a predetermined condition, letting $W_{1st.ini}$ be the photosensor signal level stored in the memory that was obtained by driving the photosensor in the sensor drive mode, $W_{3rd.ini}$ be the photosensor signal level stored in the memory that was obtained by driving the photosensor in the second correction data acquisition mode, and L be the number of photosensor signal levels, the signal processing circuit obtains a corrected photosensor signal R' from a photosensor signal R in the sensor drive mode as follows:

$$R' = L/[\{W - (W_{3rd.ini} - W_{1st.ini})\} - \{B - (B_{2nd.ini} - B_{1st.ini})\}] \times [R - \{B - (B_{2nd.ini} - B_{1st.ini})\}].$$

8. The display device according to claim 1, wherein the photosensor has one sensor switching element.

9. The display device according to claim 1, further comprising:
a common substrate opposing the active matrix substrate; and liquid crystal sandwiched between the active matrix substrate and the common substrate.

10. A display device provided with an active matrix substrate, the display device comprising:
a photosensor provided in a pixel region of the active matrix substrate;
sensor drive wiring connected to the photosensor;
a sensor driver circuit that supplies a sensor drive signal to the photosensor via the sensor drive wiring;
an amplifier circuit that amplifies sensor output that was read out from the photosensor in accordance with the sensor drive signal, and outputs the sensor output as a photosensor signal; and
a signal processing circuit that processes the photosensor signal that was output from the amplifier circuit,
wherein operation modes of the sensor driver circuit include at least
a sensor drive mode in which a sensor drive signal of a first pattern is supplied to the photosensor, and thus a photosensor signal that corresponds to the amount of light received by the photosensor is output to the signal processing circuit, and
a correction data acquisition mode in which a sensor drive signal of a second pattern that is different from the first pattern is supplied to the photosensor, and thus a correction photosensor signal level that corresponds to a case where the photosensor detected a black level or a white level is acquired,
the display device further comprises a memory that stores, as data for resolving offset in the correction photosensor signal level, a photosensor signal level that was obtained by driving the photosensor in each of the sensor drive mode and the correction data acquisition mode in an ambient environment that is controlled to a predetermined condition, and
the signal processing circuit corrects the photosensor signal in the sensor drive mode using the correction photosensor signal level that was corrected using the data for resolving offset that was read out from the memory
wherein the sensor drive wiring includes reset signal wiring that is connected to the photosensor and readout signal wiring that is connected to the photosensor,
the sensor drive signal includes a reset signal that is supplied to the photosensor via the reset signal wiring and a readout signal that is supplied to the photosensor via the readout signal wiring,
in the sensor drive mode, the sensor driver circuit supplies the photosensor with the reset signal, and then with the readout signal after a predetermined time period has elapsed, and thus a photosensor signal that corresponds to the amount of light received by the photosensor in the predetermined time period is output to the signal processing circuit,
the correction data acquisition mode includes a second correction data acquisition mode in which the sensor driver circuit supplies a readout signal whose amplitude is zero, and thus a second correction photosensor signal level W that corresponds to a case where the photosensor detected a white level is acquired, and
in an ambient environment that is controlled to a predetermined condition, letting $W_{1st.ini}$ be the photosensor signal level stored in the memory that was obtained by driving the photosensor in the sensor drive mode, $W_{3rd.ini}$ be the photosensor signal level stored in the memory that was obtained by driving the photosensor in the second correction data acquisition mode, and L be the number of photosensor signal levels, and in an ambient environment that is controlled to a predetermined condition, letting $B_{1st.ini}$ be the photosensor signal level stored in the memory that was obtained by driving the photosensor in the sensor drive mode,
the signal processing circuit obtains a corrected photosensor signal R' from a photosensor signal R in the sensor drive mode as follows:

$$R' = L \times R / \{W - (W_{3rd.ini} - W_{1st.ini}) - B_{1st.ini}\}.$$

11. The display device according to claim 10, wherein the photosensor has one sensor switching element.

12. The display device according to claim 10, further comprising:
a common substrate opposing the active matrix substrate; and liquid crystal sandwiched between the active matrix substrate and the common substrate.

13. A display device provided with an active matrix substrate, the display device comprising:
a photosensor provided in a pixel region of the active matrix substrate;
sensor drive wiring connected to the photosensor;
a sensor driver circuit that supplies a sensor drive signal to the photosensor via the sensor drive wiring;
an amplifier circuit that amplifies sensor output that was read out from the photosensor in accordance with the sensor drive signal, and outputs the sensor output as a photosensor signal; and
a signal processing circuit that processes the photosensor signal that was output from the amplifier circuit,
wherein operation modes of the sensor driver circuit include at least
a sensor drive mode in which a sensor drive signal of a first pattern is supplied to the photosensor, and thus a photosensor signal that corresponds to the amount of light received by the photosensor is output to the signal processing circuit, and
a correction data acquisition mode in which a sensor drive signal of a second pattern that is different from the first pattern is supplied to the photosensor, and thus a correction photosensor signal level that corresponds to a case where the photosensor detected a black level or a white level is acquired, the display device further comprises a memory that stores, as data for resolving offset in the correction photosensor signal level, a photosensor signal level that was obtained by driving the photosensor in each of the sensor drive mode and the correction data acquisition mode in an ambient environment that is controlled to a predetermined condition, and the signal processing circuit corrects the photosensor signal in the sensor drive mode using the correction photosensor signal level that was corrected using the data for resolving offset that was read out from the memory wherein the sensor drive wiring includes reset signal wiring that is connected to the photosensor and readout signal wiring that is connected to the photosensor, the sensor drive signal includes a reset signal that is supplied to the photosensor via the reset signal wiring and a readout signal that is supplied to the photosensor via the readout signal wiring, in the sensor drive mode, the sensor driver circuit supplies the photosensor with the reset signal, and then with the readout signal after a predetermined time period has elapsed, and thus a photosensor signal that corresponds to the amount of light received by the photosensor in the predetermined time period is output to the signal processing circuit, the correction data acquisition mode includes a first correction data acquisition mode in which the readout signal is supplied from the sensor driver circuit to the photosensor at a time that is after the start of the supply of the reset signal and before the end of the supply of the reset signal, and thus a first correction photosensor signal level B that corresponds to a case where the photosensor detected a black level is acquired, and a second correction data acquisition mode in which the sensor driver circuit supplies a readout signal whose amplitude is zero, and thus a second correction photosensor signal level W that corresponds to a case where the photosensor detected a white level is acquired, and in an ambient environment that is controlled to a predetermined condition, letting $B_{1st.ini}$ be the photosensor signal level stored in the memory that was obtained by driving the photosensor in the sensor drive mode, and $B_{2nd.ini}$ be the photosensor signal level stored in the memory that was obtained by driving the photosensor in the first correction data acquisition mode, and in an ambient environment that is controlled to a predetermined condition, letting $B_{1st.ini}$ be the photosensor signal level stored in the memory that was obtained by driving the photosensor in the sensor drive mode, $W_{3rd.ini}$ be the photosensor signal level stored in the memory that was obtained by driving the photosensor in the second correction data acquisition mode, and L be the number of photosensor signal levels, the signal processing circuit obtains a corrected photosensor signal R' from a photosensor signal R in the sensor drive mode as follows:

$$R' = L / [\{W - (W_{3rd.ini} - W_{1st.ini})\} - \{B - (B_{2nd.ini} - B_{1st.ini})\}] \times [R - \{B - (B_{2nd.ini} - B_{1st.ini})\}].$$

14. The display device according to claim 13, wherein the photosensor has one sensor switching element.

15. The display device according to claim 13, further comprising:
    a common substrate opposing the active matrix substrate; and liquid crystal sandwiched between the active matrix substrate and the common substrate.

* * * * *